United States Patent
Chung et al.

(10) Patent No.: US 10,684,793 B2
(45) Date of Patent: Jun. 16, 2020

(54) SEMICONDUCTOR MEMORY DEVICES INCLUDING ERROR CORRECTION CIRCUITS AND METHODS OF OPERATING THE SEMICONDUCTOR MEMORY DEVICES

(71) Applicant: Samsung Electronics Co., Ltd., Suwon-si, Gyeonggi-do (KR)

(72) Inventors: Hoi-ju Chung, Yongin-si (KR); Su-a Kim, Seongnam-si (KR); Mu-jin Seo, Seoul (KR); Hak-soo Yu, Seongnam-si (KR); Jae-youn Youn, Seoul (KR); Hyo-jin Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 371 days.

(21) Appl. No.: 15/462,347

(22) Filed: Mar. 17, 2017

(65) Prior Publication Data

US 2017/0192721 A1 Jul. 6, 2017

Related U.S. Application Data

(60) Continuation of application No. 14/992,472, filed on Jan. 11, 2016, now Pat. No. 9,632,856, which is a
(Continued)

(30) Foreign Application Priority Data

Feb. 26, 2013 (KR) .................... 10-2013-0020674

(51) Int. Cl.
*G06F 11/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC combination set(s) only.
See application file for complete search history.

(56) References Cited

U.S. PATENT DOCUMENTS

| 5,134,616 A | 7/1992 | Barth, Jr. et al. |
| 5,307,356 A | 4/1994 | Fifield |

(Continued)

FOREIGN PATENT DOCUMENTS

| JP | 06-089595 | 3/1994 |
| JP | H06187248 A | 7/1994 |

(Continued)

OTHER PUBLICATIONS

JEDEC Solid State Technology Association, Committee Letter Ballot, Jedec Standard DDR4 SDRAM, Dec. 2011.
(Continued)

*Primary Examiner* — Esaw T Abraham
(74) *Attorney, Agent, or Firm* — Harness, Dickey & Pierce, P.L.C.

(57) ABSTRACT

A memory controller includes a controller input/output circuit configured to output a first command to read first data, and output a second command to read an error corrected portion of the first data. A memory device includes: an error detector, a data storage circuit and an error correction circuit. The error detector is configured to detect a number of error bits in data read from a memory cell in response to a first command. The data storage circuit is configured to store the read data if the detected number of
(Continued)

error bits is greater than or equal to a first threshold value. The error correction circuit is configured to correct the stored data.

8 Claims, 32 Drawing Sheets

Related U.S. Application Data division of application No. 13/910,591, filed on Jun. 5, 2013, now Pat. No. 9,268,636.

(51) Int. Cl.
    *G06F 11/10*          (2006.01)
    *G06F 11/07*          (2006.01)
    *G11C 11/409*        (2006.01)
    *G11C 29/00*         (2006.01)
    *G11C 29/52*         (2006.01)

(52) U.S. Cl.
CPC .......... *G06F 11/073* (2013.01); *G06F 11/076* (2013.01); *G06F 11/079* (2013.01); *G06F 11/0793* (2013.01); *G06F 11/1008* (2013.01); *G06F 11/1048* (2013.01); *G06F 11/1068* (2013.01); *G06F 11/1076* (2013.01); *G11C 11/409* (2013.01); *G11C 29/52* (2013.01); *G11C 29/783* (2013.01)

(56) References Cited

U.S. PATENT DOCUMENTS

| | | | |
|---|---|---|---|
| 5,509,132 A | | 4/1996 | Matsuda et al. |
| 5,638,385 A | | 6/1997 | Fifield et al. |
| 5,956,349 A | * | 9/1999 | Watanabe ............... G11C 29/14 |
| | | | 714/718 |
| 6,003,151 A | * | 12/1999 | Chuang ............... G06F 11/1008 |
| | | | 714/48 |
| 6,480,982 B1 | * | 11/2002 | Chan ..................... G06F 11/106 |
| | | | 714/764 |
| 6,567,950 B1 | | 5/2003 | Bertin et al. |
| 7,171,594 B2 | | 1/2007 | Wyatt et al. |
| 7,203,889 B2 | | 4/2007 | Oza et al. |
| 7,206,988 B1 | | 4/2007 | Solt et al. |
| 7,227,797 B2 | | 6/2007 | Thayer et al. |
| 7,249,289 B2 | | 7/2007 | Muranaka et al. |
| 7,286,416 B2 | | 10/2007 | Ooishi et al. |
| 7,404,137 B2 | | 7/2008 | Lin et al. |
| 7,508,704 B2 | | 3/2009 | Honma et al. |
| 7,590,919 B2 | | 9/2009 | Kanno |
| 7,603,592 B2 | | 10/2009 | Sekiguchi et al. |
| 7,610,542 B2 | | 10/2009 | Nagai |
| 7,672,173 B2 | | 3/2010 | Ooishi et al. |
| 7,759,968 B1 | | 7/2010 | Hussein et al. |
| 7,793,192 B2 | | 9/2010 | Tamura et al. |
| 8,069,389 B2 | | 11/2011 | Yim et al. |
| 8,103,930 B2 | | 1/2012 | Barrett et al. |
| 8,103,936 B2 | * | 1/2012 | Pekny ................. G06F 13/4291 |
| | | | 714/763 |
| 8,130,571 B2 | | 3/2012 | Shinagawa et al. |
| 8,151,173 B2 | | 4/2012 | Hirose et al. |
| 8,276,039 B2 | | 9/2012 | Wuu et al. |
| 8,375,257 B2 | | 2/2013 | Hong et al. |
| 8,612,830 B2 | * | 12/2013 | Kitahara ............. G06F 11/1068 |
| | | | 711/103 |
| 8,732,553 B2 | | 5/2014 | Nagadomi et al. |
| 8,775,899 B2 | | 7/2014 | Kamoshida |
| 8,880,970 B2 | * | 11/2014 | Gillingham ............. G06F 11/10 |
| | | | 714/748 |
| 8,949,690 B2 | | 2/2015 | Sugahara et al. |
| 9,053,813 B2 | | 6/2015 | Kang et al. |
| 9,312,013 B1 | | 4/2016 | Lin et al. |
| 9,817,711 B2 | | 11/2017 | Sugahara et al. |
| 2003/0172328 A1 | | 9/2003 | Wyatt et al. |
| 2004/0163027 A1 | | 8/2004 | MacLaren et al. |
| 2005/0160311 A1 | | 7/2005 | Hartwell et al. |
| 2006/0136800 A1 | | 6/2006 | Kawabata et al. |
| 2008/0168319 A1 | | 7/2008 | Lee et al. |
| 2008/0222490 A1 | * | 9/2008 | Leung ................. G06F 11/1068 |
| | | | 714/763 |
| 2008/0229176 A1 | | 9/2008 | Arnez et al. |
| 2009/0070523 A1 | | 3/2009 | Kim et al. |
| 2010/0257430 A1 | | 10/2010 | Chen |
| 2011/0087832 A1 | * | 4/2011 | Biswas ............... G06F 12/0246 |
| | | | 711/103 |
| 2011/0099459 A1 | | 4/2011 | Nakamura et al. |
| 2013/0007564 A1 | | 1/2013 | Bedeschi et al. |
| 2013/0031439 A1 | | 1/2013 | Moon et al. |
| 2015/0248329 A1 | | 9/2015 | Kang et al. |

FOREIGN PATENT DOCUMENTS

| | | |
|---|---|---|
| JP | 2571317 B2 | 1/1997 |
| JP | 2005-116080 A | 4/2005 |
| JP | 2007-042176 A | 2/2007 |
| JP | 2009054275 A | 3/2009 |
| JP | 2013003656 A | 1/2013 |
| KR | 10-1124860 B1 | 3/2012 |
| KR | 2012-0136674 | 12/2012 |

OTHER PUBLICATIONS

U.S. Office Action issued in U.S. Appl. No. 13/910,591, dated Apr. 17, 2015.
U.S. Notice of Allowance issued in U.S. Appl. No. 13/910,591, dated Oct. 9, 2015.
U.S. Office Action issued in U.S. Appl. No. 14/992,472, dated Aug. 4, 2016.
U.S. Notice of Allowance issued in U.S. Appl. No. 14/992,472, dated Dec. 16, 2016.
Korean Office Action dated May 29, 2019, issued in corresponding Korean Patent Application No. KR 10-2013-0020674.

* cited by examiner

1300A

|  | Valid | Invalid |
|---|---|---|
| CASE 1 | error # = 0 | error # ≥ 1 |
| CASE 2 | error # ≤ 1 | error # ≥ 2 |
| CASE 3 | error # ≤ 3 | error # ≥ 4 |

1300B

|  | Valid | Invalid | Uncorrectable |
|---|---|---|---|
| CASE 1 | error # = 0 | error # = 1 | error # ≥ 2 |
| CASE 2 | error # ≤ 1 | error # = 2 | error # ≥ 3 |
| CASE 3 | error # ≤ 1 | 2 ≤ error # ≤ 3 | error # ≥ 4 |

|        | Alert                              | DQ and/or DM         |
|--------|------------------------------------|----------------------|
| CASE 1 | Info_valid                         |                      |
| CASE 2 | Info_valid<br>Info_BA, BF, uncor   |                      |
| CASE 3 | Info_valid, uncor                  | Info_BA, BF          |
| CASE 4 | Info_valid                         | Info_BA, BF, uncor   |

|        | DQ                                 | DM                                 |
|--------|------------------------------------|------------------------------------|
| CASE 1 | Info_valid                         |                                    |
| CASE 2 |                                    | Info_valid                         |
| CASE 3 | Info_valid                         | Info_BA, BF, uncor                 |
| CASE 4 | Info_BA, BF, uncor                 | Info_valid                         |
| CASE 5 | Info_valid<br>Info_BA, BF, uncor   |                                    |
| CASE 6 |                                    | Info_valid<br>Info_BA, BF, uncor   |

SEMICONDUCTOR MEMORY DEVICES INCLUDING ERROR CORRECTION CIRCUITS AND METHODS OF OPERATING THE SEMICONDUCTOR MEMORY DEVICES

CROSS-REFERENCE TO RELATED APPLICATIONS

This application is a Continuation of U.S. application Ser. No. 14/992,472, filed Jan. 11, 2016, (now U.S. Pat. No. 9,632,856, issued Apr. 25, 2017), which is a Divisional of U.S. application Ser. No. 13/910,591, filed Jun. 5, 2013, (now U.S. Pat. No. 9,268,636, issued Feb. 23, 2016), which claims priority under 35 U.S.C. § 119 to Korean Patent Application No. 10-2013-0020674, filed on Feb. 26, 2013, in the Korean Intellectual Property Office, the entire contents of each of which are incorporated herein by reference.

BACKGROUND

Field

Example embodiments relate to semiconductor memory devices and methods of operating the same, for example, semiconductor memory devices including error correction circuits and methods of operating semiconductor memory devices.

Description of Conventional Art

Capacity and speed are increasing for semiconductor memory devices that are widely used in high performance electronic systems. A dynamic random access memory (DRAM), which is an example of a semiconductor memory device, is a memory that determines data by using charges stored in a capacitor.

While process scaling continues, a bit error rate (BER) of semiconductor memory devices may increase. Thus, resources such as repair cells may have to be increased to provide data reliability in response to the increase in the BER. However, if the resources increase, chip size overhead may increase, and ensuring stable operation of the semiconductor memory device at a relatively high BER may be more difficult.

SUMMARY

Example embodiments provide semiconductor memory devices in which errors that may occur when data is accessed may be more stably corrected and/or an error correction speed may be improved, and methods of operating semiconductor memory devices. Example embodiments also provide memory systems, memory controllers, memory modules, computer systems, and methods of operating the same.

According at least some example embodiments, data errors may be more stably corrected even when bit error rates (BERs) increase, and an increase in required resources relative to the increase of the BER may be reduced.

In addition, multi-bit errors may be corrected, and thus, reliability of data may be improved. An increase in overhead generated in terms of timing by correction of the multi-bit error may be reduced and/or minimized, thereby improving performance of the semiconductor memory device.

At least one example embodiment provides a memory controller including: a controller input/output circuit configured to output a first command to read first data, and output a second command to read an error corrected portion of the first data.

At least one other example embodiment provides a memory device comprising: an error correction circuit configured to correct errors in data read from a memory cell in response to a first command; and a data output circuit configured to output the corrected data in response to a second command.

At least one other example embodiment provides a memory device including: an error detector configured to detect a number of error bits in data read from a memory cell in response to a first command; a data storage circuit configured to store the read data if the detected number of error bits is greater than or equal to a first threshold value; and an error correction circuit configured to correct the stored data.

At least one other example embodiment provides a memory device including: an error detector configured to detect a number of error bits in data read from a memory cell in response to a received first command; and a correction status information generator configured to output correction status information associated with the read data, the correction status information indicating whether the detected number of error bits is greater than or equal to a first threshold value.

At least one other example embodiment provides a memory device including: an error detector configured to detect a number of error bits in data read from a memory cell in response to a first command; a data storage circuit configured to store the read data in a data storage circuit if the detected number of error bits is greater than or equal to a first threshold value; a management circuit configured to check a data storage status indicator in response to a second command, the data storage status indicator indicating whether the read data is stored in the data storage circuit; and a data output circuit configured to output one of corrected data from the data storage circuit and second data from the memory cell based on the data storage status indicator.

At least one other example embodiment provides a memory device including: an error detector configured to detect a number of error bits in data read from a memory cell in response to a first command; a data storage circuit configured to store the read data if the detected number of error bits is greater than or equal to a first threshold value, the data storage circuit being further configured to store a data storage status indicator and address information associated with the read data; an address matching circuit configured to compare received address information with the address information stored in the data storage circuit in response to a received second command; and a management circuit configured to set the data storage status indicator if the received address information matches the stored address information.

At least one other example embodiment provides a memory system including: a memory controller configured to output first and second commands; and a memory device. The memory device includes: an error correction circuit configured to correct errors in data read from a memory cell in response to the first command; and a data output circuit configured to output the corrected data in response to the second command.

At least one other example embodiment provides a memory system including: a memory controller configured to output a first command; and a memory device. The memory device includes: an error detector configured to detect a number of error bits in data read from a memory cell in response to the first command; a data storage circuit configured to store the read data if the detected number of error bits is greater than or equal to a first threshold value; and an error correction circuit configured to correct the stored data.

At least one other example embodiment provides a memory system including: a memory controller configured to output a first command; and a memory device. The memory device includes: an error detector configured to detect a number of error bits in data read from a memory cell in response to the first command; and a correction status information generator configured to output correction status information associated with the read data, the correction status information indicating whether the detected number of error bits is greater than or equal to a first threshold value.

At least one other example embodiment provides a memory system including: a memory controller configured to output first and second commands; and a memory device. The memory device include: an error detector configured to detect a number of error bits in data read from a memory cell in response to the first command; a data storage circuit configured to store the read data for error correction if the detected number of error bits is greater than or equal to a first threshold value; a management circuit configured to check a data storage status indicator in response to the second command, the data storage status indicator indicating whether the read data is stored in the data storage circuit; and a data output circuit configured to output one of corrected data from the data storage circuit and second data from the memory cell based on the data storage status indicator.

At least one other example embodiment provides a memory system including: a memory controller configured to output first and second commands; and a memory device. The memory device includes: an error detector configured to detect a number of error bits in data read from a memory cell in response to the first command; a data storage circuit configured to store the read data if the detected number of error bits is greater than or equal to a first threshold value, the data storage circuit being further configured to store a data storage status indicator and address information associated with the read data; an address matching circuit configured to compare received address information with the address information stored in the data storage circuit in response to the second command; and a management circuit configured to set the data storage status indicator if the received address information matches the stored address information.

At least one other example embodiment provides a memory system including: a memory controller configured to output first and second commands; and a memory chip coupled to the memory controller, the memory chip having an error correction apparatus. The error correction apparatus includes: an error correction circuit configured to correct errors in data read from a memory cell in response to the first command; and a data output circuit configured to output the corrected data in response to the second command.

At least one other example embodiment provides a memory system including: a memory controller configured to output first and second commands; and a memory chip coupled to the memory controller, the memory chip having an error correction apparatus. The error correction apparatus includes: an error detector configured to detect a number of error bits in data read from a memory cell in response to the first command; a data storage circuit configured to store the read data if the detected number of error bits is greater than or equal to a first threshold value; and an error correction circuit configured to correct the stored data.

At least one other example embodiment provides a memory system including: a memory controller configured to output first and second commands; and a memory chip coupled to the memory controller, the memory chip having an error correction apparatus. The error correction apparatus includes: an error detector configured to detect a number of error bits in data read from a memory cell in response to the first command; and a correction status information generator configured to output correction status information associated with the read data, the correction status information indicating whether the detected number of error bits is greater than or equal to a first threshold value.

At least one other example embodiment provides a memory system including: a memory controller configured to output first and second commands; and a memory chip coupled to the memory controller, the memory chip having an error correction apparatus. The error correction apparatus includes: an error detector configured to detect a number of error bits in data read from a memory cell in response to the first command; a data storage circuit configured to store the read data for error correction if the number of error bits is greater than or equal to a first threshold value; a management circuit configured to check a data storage status indicator in response to the second command, the data storage status indicator indicating whether the read data is stored in the data storage circuit; and a data output circuit configured to output one of corrected data from the data storage circuit and second data from the memory cell based on the data storage status indicator.

At least one other example embodiment provides a memory system including: a memory controller configured to output first and second commands; and a memory chip coupled to the memory controller, the memory chip having an error correction apparatus. The error correction apparatus includes: an error detector configured to detect a number of error bits in data read from a memory cell in response to the first command; a data storage circuit configured to store the read data if the detected number of error bits is greater than or equal to a first threshold value, the data storage circuit being further configured to store a data storage status indicator and address information associated with the read data; an address matching circuit configured to compare received address information with the address information stored in the data storage circuit in response to the second command; and a management circuit configured to set the data storage status indicator if the received address information matches the stored address information.

At least one other example embodiment provides a method of operating a memory controller, the method including: outputting a first command to read first data; and outputting a second command to read an error corrected portion of the first data.

At least one other example embodiment provides a method of operating a memory device, the method including: correcting errors in data read from a memory cell in response to a first command; and outputting the corrected data in response to a second command.

At least one other example embodiment provides a method of operating a memory device, the method including: detecting a number of error bits in data read from a memory cell in response to a first command; storing the read data if the detected number of error bits is greater than or equal to a first threshold value; and correcting the stored data.

At least one other example embodiment provides a method of operating a memory device, the method including: detecting a number of error bits in data read from a memory cell in response to a received command; and outputting error correction status information associated with the read data, the error correction status information indicating whether the detected number of error bits is greater than or equal to a first threshold value.

At least one other example embodiment provides a method of operating a memory device, the method including: detecting a number of error bits in data read from a memory cell in response to a first command; storing the read data for error correction in a data storage circuit if the number of error bits is greater than or equal to a first threshold value; checking a data storage status indicator in response to a second command, the data storage status indicator indicating whether the read data is stored in the data storage circuit; and outputting one of corrected data and second data from the memory cell based on the data storage status indicator.

At least one other example embodiment provides a method of operating a memory device, the method including: detecting a number of error bits in data read from a memory cell in response to a first command; storing the read data, a data storage status indicator and address information associated with the read data if the detected number of error bits is greater than or equal to a first threshold value; comparing received address information with the stored address information in response to a received second command; and setting the data storage status indicator if the received address information matches the stored address information.

BRIEF DESCRIPTION OF THE DRAWINGS

Example embodiments will be more clearly understood from the following detailed description taken in conjunction with the accompanying drawings in which:

FIGS. 7A and 7B are tables showing examples of output of information through various terminals;

DETAILED DESCRIPTION

Figure 1:
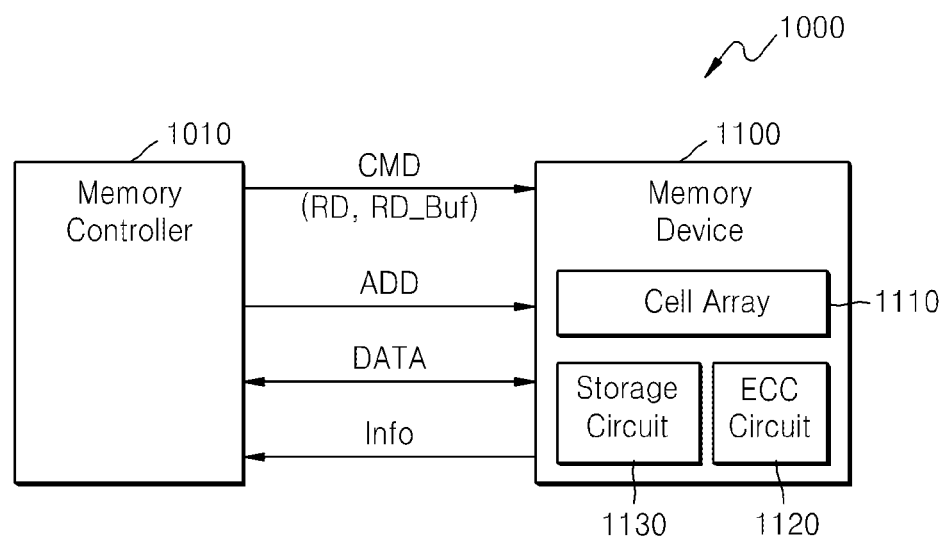
FIG. 1 is a block diagram illustrating a memory system including a semiconductor memory device according to an example embodiment.

Example embodiments will now be described more fully hereinafter with reference to the accompanying drawings, in which some example embodiments of inventive concepts are shown. However, example embodiments may be embodied in many different forms and should not be construed as limited to the embodiments set forth herein. Rather, these example embodiments are provided so that this disclosure will be thorough and complete, and will fully convey the scope of inventive concepts to those skilled in the art.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams in order not to obscure the example embodiments in unnecessary detail. In other instances, well-known processes, structures and techniques may be shown without unnecessary detail in order to avoid obscuring example embodiments.

Also, it is noted that example embodiments may be described as a process depicted as a flowchart, a flow diagram, a data flow diagram, a structure diagram, or a block diagram. Although a flowchart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, a function, a procedure, a subroutine, a subprogram, etc. When a process corresponds to a function, its termination may correspond to a return of the function to the calling function or the main function.

Moreover, as disclosed herein, the term "buffer," "memory" or the like, may represent one or more devices for storing data, including random access memory (RAM), magnetic RAM, core memory, and/or other machine readable mediums for storing information. The term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" may include, but is not limited to, portable or fixed storage devices, optical storage devices, and various other mediums capable of storing or containing instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

A code segment may represent a procedure, a function, a subprogram, a program, a routine, a subroutine, a module, a software package, a class, or any combination of instructions, data structures, or program statements.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items.

As process scaling of semiconductor memory devices continues, bit error rates (BERs) of memory cells increases. For example, a dynamic random access memory (DRAM) is a memory device having finite data retention characteristics, and as process scaling of a DRAM continues, a capacitance of a cell capacitor decreases, which increases BER and may decrease data reliability. According to example embodiments, an error correction circuit configured to correct error bits is included in a semiconductor memory device, and thus, more stable operation of the semiconductor memory device may be secured even at relatively high BERs.

FIG. 1 is a block diagram illustrating a memory system 1000 including a semiconductor memory device according to an example embodiment.

As illustrated in FIG. 1, the memory system 1000 includes a memory controller 1010 and a semiconductor memory device 1100. The memory controller 1010 provides various control signals to the semiconductor memory device 1100 to control memory operations. For example, the memory controller 1010 provides a command CMD and an address ADD to the semiconductor memory device 1100 to access data of a cell array 1110. The command CMD may be a command related to various memory operations such as data read/write operation. When the semiconductor memory device 1100 includes a DRAM cell, for example, the command CMD may include a command for various unique operations to a DRAM, such as a refresh command for refreshing a memory cell. While not illustrated in FIG. 1, other signals related to memory operations (e.g., a masking signal for masking data or a clock signal for synchronizing a memory operation) may be transmitted or received between the memory controller 1010 and the semiconductor memory device 1100.

According to at least one example embodiment, the memory controller 1010 is configured to output a first command to read first data from the memory device 1100, and to output a second command to read an error corrected portion of the first data from the memory device 1100. The memory controller may include a controller input/output circuit configured to output a first command to read first data, and output a second command to read an error corrected portion of the first data.

Still referring to FIG. 1, the semiconductor memory device 1100 includes a cell array 1110 including a plurality of memory cells, an error correction circuit (ECC) circuit 1120 to correct errors with respect to data read from the cell array 1110, and a storage circuit 1130 (or data storage circuit) to temporarily store the read data. The data storage circuit 1130 may be formed of various volatile or non-volatile memory circuits capable of storing various types of information. In one example, the data storage circuit 1130 may be a buffer or a register. The data storage circuit 1130 described below may store data information, address information, and various flag information. As discussed herein, a storage circuit or data storage circuit may sometimes be referred to as a data buffer.

The cell array 1110 includes a plurality of regions, which may be defined in various forms. For example, the regions may be defined as page sizes selected in response to a row address or sizes in error correction circuits. The size of the regions may vary according to a structure of the cell array 1110. For example, when the regions are defined in error correction circuits, at least two regions may be included in each page.

The ECC circuit 1120 may perform various functions related to error detection and correction. In one example, the ECC circuit 1120 generates a parity bit via an ECC encoding operation when a data write operation is performed, and corrects error bits generated in read data via an ECC decoding operation. The ECC circuit 1120 may include an ECC encoder (not shown) that generates a parity bit, an error detector (not shown) that detects the number of error bits generated in read data (or a code word including data and a parity bit), and an error correction circuit (not shown) that corrects error bits.

A number of error bits (or error bit number) that the ECC circuit 1120 may correct per error correction circuit may vary according to an algorithm applied to perform error correction. For example, in order to allow a relatively stable operation of the semiconductor memory device 1100 even at relatively high BERs, the ECC circuit 1120 may correct a multi-bit error. In order to reduce and/or minimize degradation in system performance due to an increase in overhead in terms of timing due to time required to correct a multi-bit error, if a multi-bit error is generated in data read in response to a read command, then information indicating that the data read according to the read command is not valid is provided to the memory controller 1010. The read data in which a multi-bit error is generated may be temporarily stored in the data storage circuit 1130, and then error of the data stored in the data storage circuit 1130 may be corrected using the ECC circuit 1120. After a given, desired or predetermined latency (or after error correction), the error-corrected data is output to the memory controller 1010. Alternatively, error-corrected data may be stored in the data storage circuit 1130, and the error-corrected data stored in the data storage circuit 1130 may be output to the memory controller 1010 in response to a given, desired or predetermined command transmitted from the memory controller 1010.

As discussed herein, the number of error bits sufficient to render read data invalid may be referred to as a threshold value. Similarly, the maximum number of error bits correctable by a memory device may also be referred to as a threshold value.

To perform the above-described operation, the semiconductor memory device 1100 provides information indicating whether requested data is valid or not to the memory controller 1010. For example, in response to a read command RD from the memory controller 1010, the semiconductor memory device 1100 may read and provide data and a parity bit stored in the cell array 1110 to the ECC circuit 1120. The ECC circuit 1120 detects the number of error bits in the data and generates a detection result. A circuit (not shown) for generating the information Info may be further included in the semiconductor memory device 1100, and information indicating whether corresponding data is valid or not based on the detected number of error bits may be provided to the memory controller 1010. The information Info may also be referred to herein as correction status information.

In one example, the validity of the read data may be determined by comparison of the detected number of error bits with a threshold value. If the detected number of error bits is, for example, less than a first threshold value, then the read data may be valid, whereas if the detected number of error bits is greater than or equal to the first threshold value, then the read data may be invalid.

In a more specific example, if no error is generated in the read data or only one error bit is generated per error correction circuit, then read data or data for which the 1 bit error is corrected may be provided to the memory controller 1010 together with the information Info indicating whether corresponding data is valid or not. On the other hand, when at least two error bits are generated, information Info indicating that corresponding data is not valid is provided to the memory controller 1010, and an error correction operation to correct the at least two error bits is performed in the semiconductor memory device 1100.

In one example, data for which error correction is completed may be provided to the memory controller 1010 without receiving any additional command. Alternatively, data for which at least two error bits are corrected may be stored in the data storage circuit 1130, and the error-corrected data stored in the data storage circuit 1130 may be provided to the memory controller 1010 in response to a further command sent from the memory controller 1010. For example, in order to access data stored in the data storage circuit 1130, a buffer read command RD_Buf is defined as a new command between the memory controller 1010 and the semiconductor memory device 1100. The data stored in the data storage circuit 1130 is accessed in response to the buffer read command RD_Buf from the memory controller 1010.

Alternatively, the memory controller 1010 may output a typical (or conventional) read command RD and an address (e.g., a read address). In this example, the semiconductor memory device 1100 outputs data stored in the data storage circuit 1130 in response to the read command RD and the address ADD. If data read in response to a previous read command RD is not valid, then data including an error and address information corresponding to this data is stored in the data storage circuit 1130. Subsequently, when a read command RD is received, an address accompanying the read command RD (e.g., a read address) is compared to the address information stored in the data storage circuit 1130, and the data stored in the data storage circuit 1130 (e.g., error-corrected data) may be provided to the memory controller 1010 according to a result of the comparison.

As standards for determining validity of data, the number of error bits per error correction circuit may be set as desired. For example, in consideration of time needed for error correction according to the number of errors, when at least two errors are detected per error correction circuit as described above, it may be determined that corresponding data is not valid.

When at least one error bit is detected, it may also be determined that corresponding data is not valid. In this case, if no error is generated per an error correction circuit, then information Info indicating that corresponding data is valid is output to the memory controller 1010 and the read data is output to the memory controller 1010 without being error corrected.

On the other hand, when at least one error bit is detected in data per error correction circuit, information Info indicating that corresponding data is not valid is output to the memory controller 1010, and the read data is stored in the data storage circuit 1130. Thereafter, the error of the data stored in the data storage circuit 1130 is corrected by the ECC circuit 1120. After a given, desired or predetermined latency or in response to a command RD or RD_Buf sent from the memory controller 1010, the error-corrected data stored in the data storage circuit 1130 is provided to the memory controller 1010.

Alternatively, according to another example embodiment, when the read data is not valid, the semiconductor memory device 1100 outputs information Info indicating that corresponding data is not valid, and outputs the data including error(s) to the memory controller 1010. In this example, even when the memory controller 1010 receives data having an error, the memory controller 1010 may ignore the received data depending on information Info indicating that corresponding data is not valid.

According to at least the example embodiment described above, the number of error bits is detected before correcting a multi-bit error. If there is no error or only one error bit is generated, then the error may be immediately output or corrected and then output. When at least two error bits are generated, information Info indicating that corresponding data is not valid is output to the memory controller 1010 so that the memory controller 1010 may perform subsequent operations while the multi-bit error is being corrected. Upon receiving the information Info indicating that corresponding data is not valid, the memory controller 1010 determines whether to access the data again later. After a given, desired or predetermined delay time (latency), the memory controller 1010 outputs a command RD or RD_Buf to access data stored in the data storage circuit 1130 (error-corrected data).

According to at least some example embodiments described herein, reliability of a memory operation may be improved at relatively high BERs, and/or degradation in system performance, which occurs when correcting a multi-bit error, may be reduced and/or minimized.

Figure 2:
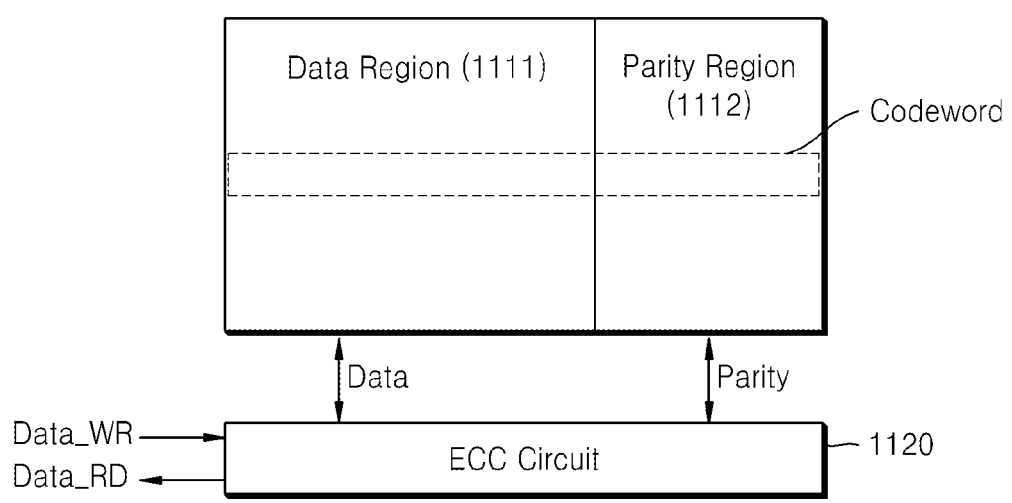
FIG. 2 is a block diagram illustrating a cell array of the semiconductor memory device of FIG. 1.

FIG. 2 is a block diagram illustrating the cell array 1110 of the semiconductor memory device 1000 of FIG. 1 according to an example embodiment. As illustrated in FIG. 2, the cell array 1110 includes a data region 1111 in which data is stored, and a parity region 1112 in which a parity bit for error correction is stored. The data region 1111 includes a plurality of memory cells, and the parity region 1112 includes a plurality of parity cells.

When a data write operation is performed, write data Data_WR is received from a memory controller and provided to the ECC circuit 1120. The ECC circuit 1120 generates a parity bit for each error correction circuit of the write data Data_WR. The write data Data_WR and a corresponding parity bit are stored in the data region 1111 and the parity region 1112, respectively.

When a data read operation is performed, data and a parity bit are read from the data region 1111 and the parity region 1112, respectively, and the ECC circuit 1120 performs an error correction operation by using the data in error correction circuits and parity bits corresponding to the data in error correction circuits. The error-corrected data is provided to an external memory controller as read data Data_RD.

A codeword including data and a parity bit may be defined as an error correction unit. In the cell array 1110 of FIG. 2, memory cells and parity cells connected to the same word line are selected in response to one row address. The codeword defined as described above is an error correction unit and may have a size including at least some of memory cells and at least some of parity cells connected to the same word line. While one page of the cell array 1110 is illustrated as a codeword, example embodiments are not limited thereto.

Figure 3:
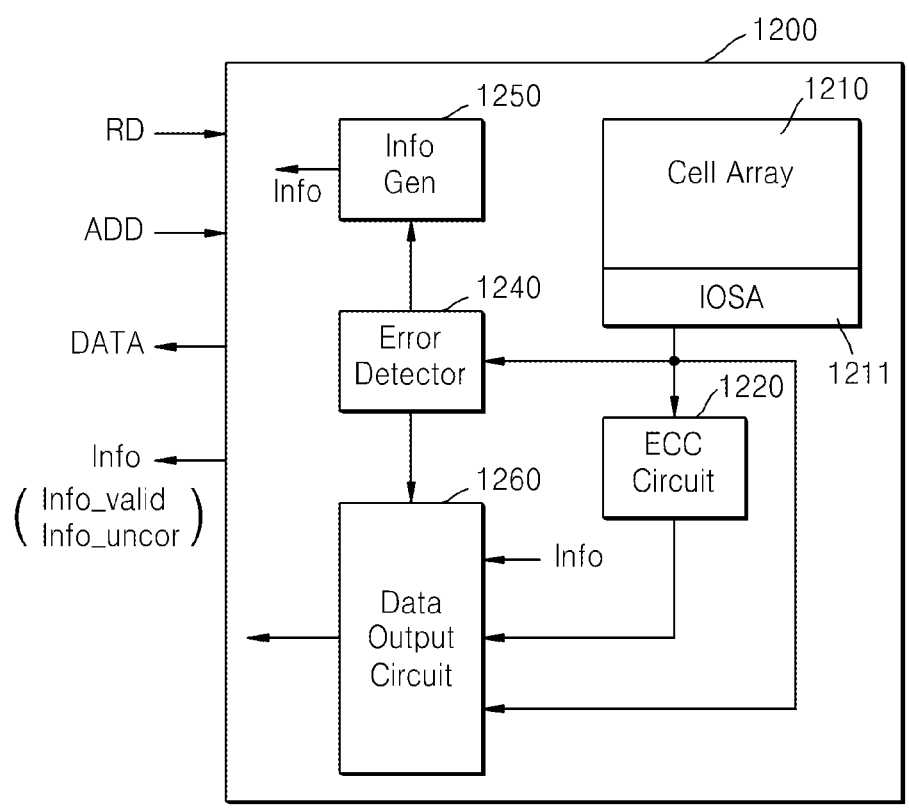
FIG. 3 is a block diagram illustrating a semiconductor memory device according to another example embodiment.

FIG. 3 is a block diagram illustrating a semiconductor memory device 1200 according to another example embodiment.

As illustrated in FIG. 3, the semiconductor memory device 1200 includes a cell array 1210, an input/output sense amplifier 1211, an ECC circuit 1220, an error detector 1240, an information generating circuit 1250, and a data output circuit 1260.

Referring to FIG. 3, the ECC circuit 1220 performs ECC encoding to generate a parity bit and error correction with respect to data read from the cell array 1210. Also, the ECC circuit 1220 performs an operation of detecting the number of error bits (hereinafter, the number of error bits will be defined to be the same as the number of errors) of the read data before an actual error correction operation.

Apart from the operation of the ECC circuit 1220, the error detector 1240 receives data read from the cell array 1210, and performs an operation of detecting the number of error bits generated in the read data. For example, the error detector 1240 may calculate at least one syndrome from the read data, and detect the number of error bits via a calculation operation with respect to the calculated at least one syndrome. According to at least this example embodiment, the error detector 1240 and the ECC circuit 1220 may be separately implemented, or the error detector 1240 may by omitted. In this example, results of error detection that may be performed during ECC decoding by the ECC circuit 1220 may be directly provided to the information generating circuit 1250.

An example operation of the semiconductor memory device 1200 of FIG. 3 will be described below. In this example, with regard to FIG. 3, it is assumed that when no error is generated in the read data (or a codeword as an error correction circuit), corresponding data is determined as valid, and when at least one error is generated, corresponding data is determined as not valid.

In response to a read command RD and an address ADD provided to the semiconductor memory device 1200, data is read from a region of the cell array 1210 corresponding to the address ADD, and the read data is provided to the error detector 1240 via the input/output sense amplifier 1211. The error detector 1240 detects the number of errors generated in the read data (or the number of errors per error correction unit) and outputs a detection signal according to a result of the detection.

The information generating circuit 1250 outputs first information Info_valid indicating whether corresponding data is valid, in response to the detection signal. For example, when no error is generated in the read data (e.g., a number of error bits is less than a threshold 1), the information generating circuit 1250 activates the first information Info_valid and outputs the same, whereas when an error is generated in the read data (e.g., the number of error bits is greater than the first threshold 1), the information generating circuit 1250 deactivates the first information Info_valid and outputs the same. A memory controller determines the data provided by the semiconductor memory device 1200 as valid upon receiving the activated first information Info_valid. In contrast, when the memory controller receives deactivated first information Info_valid, the memory controller determines that an error is generated in the data that is read in response to the read command RD, and does not start subsequent operations until error-corrected data is received (e.g., a command output operation for a memory operation).

In addition, the information generating circuit 1250 may output second information Info_uncor indicating whether error correction of corresponding data is possible or not in response to the detection signal. The number of error bits that are correctable may be determined according to error correction algorithms performed by the ECC circuit 1220. In one example, it may be assumed that three or less error bits may be corrected by the ECC circuit 1220. In this case, the information generating circuit 1250 may determine whether at least four errors are generated in the read data based on a detection signal, and may activate second information Info_uncor indicating that uncorrectable error is generated in the corresponding data and output the same based on a result the determination. For example, the information generating circuit 1250 may compare the detected number of error bits in read data with a threshold (e.g., 3), and generate the second information Info-uncor based on the comparison. If the detected number of error bits is greater than the threshold, then the information generating circuit 1250 may activate second information Info_uncor indicating that uncorrectable error is generated in the corresponding data and output the same.

A detection signal transmitted from the error detector 1240 is provided to the data output circuit 1260. The data output circuit 1260 receives data from the cell array 1210, and error-corrected data from the ECC circuit 1220. The data output circuit 1260 also receives the first and second information Info_valid and Info_uncor described above from the information generating circuit 1250 as various types of information Info. The data output circuit 1260 performs an operation of selecting an output in response to a detection signal. For example, when no error is generated in the read data, the data output circuit 1260 may immediately output data from the cell array 1210. On the other hand, if an error is generated in the read data, then the data output circuit 1260 may receive error-corrected data from the ECC circuit 1220 and output the same to the memory controller. Also, the data output circuit 1260 may output information Info indicating whether to output valid data.

Figures 4, 5, 6:
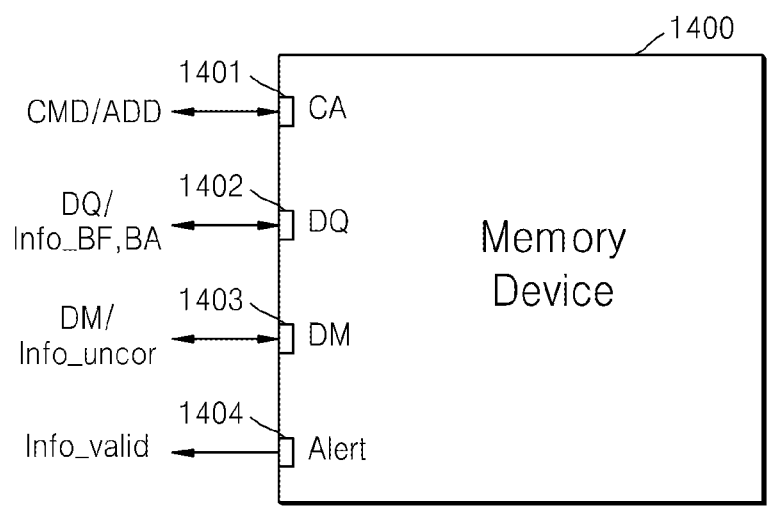
FIGS. 4 and 5 are tables showing examples of various types of information according to results of error detection.
FIG. 6 is a block diagram illustrating examples of various types of information that are generated and output by a memory device according to an error detection result.

FIGS. 4 and 5 are tables 1300A and 1300B showing examples of various types of information according to results of error detection. FIG. 4 shows examples of first information Info_valid indicating whether data is valid or not output by using an information generating circuit. FIG. 5 shows examples of second information Info_uncor indicating uncorrectable error is generated output by using an information generating circuit.

As shown in the table 1300A of FIG. 4, first information Info_valid may be output according to various conditions. For example, as in Case 1, when no error is generated in data, it is determined that corresponding data is valid, and activated first information Info_valid is provided to a memory controller. On the other hand, when at least one error is generated in data, it is determined that corresponding data is not valid, and deactivated first information Info_valid is provided to the memory controller.

As in Case 2, when no error is generated in data or only one error is generated, it is determined that corresponding data is valid, and activated first information Info_valid is provided to the memory controller. On the other hand, when at least two errors are generated in data, it is determined that corresponding data is not valid, and deactivated first information Info_valid is provided to the memory controller.

As in Case 3, when three or less errors are generated in data, it is determined that corresponding data is valid, and activated first information Info_valid is provided to the memory controller. On the other hand, when at least four errors are generated in data, it is determined that corresponding data is not valid, and deactivated first information Info_valid is provided to the memory controller.

As shown in Table 1300B of FIG. 5, first information Info_valid and second information Info_uncor may be output according to various conditions. For example, as in Case 1, when no error is generated in data, first information Info_valid is activated. When only one error is generated, the first information Info_valid is deactivated. When at least two errors are generated, second information Info_uncor is activated.

As in Case 2, when one or less error is generated in data, first information Info_valid is activated, and when only two errors are generated, the first information Info_valid is deactivated. When at least three errors are generated, second information Info_uncor is activated.

As in Case 3, when one or less error is generated in data, first information Info_valid is activated. When only two or three errors are generated, the first information Info_valid is deactivated. When at least four errors are generated, second information Info_uncor is activated.

While it is shown in tables 1300A and 1300B of FIGS. 4 and 5 that first information is activated when read data is valid, example embodiments are not limited thereto. In other words, when read data is valid, the first information may have any value among a logic low signal or a logic high signal, and this may be applied to other types of information in the same or similar manner.

FIG. 6 is a block diagram illustrating examples of various types of information that are generated and output according to an error detection result. As illustrated in FIG. 6, a semiconductor memory device 1400 includes a plurality of terminals through which to transmit or receive signals with respect to the memory controller. In one example, the semiconductor memory device 1400 includes a first terminal 1401 CA through which a command/address is received from the memory controller, a second terminal 1402 DQ through which data is transmitted or received with respect to the memory controller, and a third terminal 1403 DM through which a data masking signal is received from the memory controller. Also, according to at least some example embodiments, the semiconductor memory device 1400 further includes a fourth terminal 1404 Alert added to output information indicating whether data is valid.

In the example embodiment described above with reference to FIG. 1, the data storage circuit 1130 may include a buffer that stores data read in response to any read command, or may include a plurality of buffers that store data read according to different commands. Data of a cell array is read in response to the read command, and as it is determined that the read data is not valid, the read data may be stored in any one of the plurality of buffers. In this case, in addition to first and second information Info_valid and Infor_uncor, third information indicating a position of a buffer in which the data is stored (e.g., buffer address information Info_BA) may be further provided to the memory controller. For example, in the example embodiment described with reference to FIG. 1, information regarding data storage may be provided from a circuit that manages storage and removal of data of the data storage circuit 1130, and the third information (e.g., info_BA) may be generated based on corresponding information.

Also, when a read operation of data is continuously performed, fourth information Info_BF indicating whether a buffer for storing invalid data is available or not (or whether all buffers are currently in use) may be further provided to the memory controller. For example, four buffers for storing data that is read in response to different read commands may be included, and when all of data that is stored in the four buffers as data accessed in response to a previous read command is not valid, corresponding data read according to the subsequent read command may not be stored in the data storage circuit 1130 even when data read according to a subsequent a read command is not valid. That is, for example, the memory controller may receive activated fourth information Info_BF, and in this case, the memory controller may output a command that requests another memory operation without having to wait for data responding to the read command (e.g., error-corrected data) to be received.

According to at least this example embodiment, various types of information Info may be provided to the memory controller based on an error detection operation, and the information Info may be provided to the memory controller through at least one terminal from among the first through fourth terminals 1401 through 1404. FIG. 6 illustrates various types of information being output through the fourth terminal Alert in addition to the second and third terminals 1402 and 1403 DQ and DM according to the conventional art. Also, concurrently and/or simultaneously with data DQ transmitted or received through the second terminal DQ, the third and fourth information Info_BA and Info_BF described above may be provided to the memory controller via the second terminal DQ. And, simultaneously and/or concurrently when receiving a data masking signal DM through the third terminal DM, the second information Info_uncor may be provided to the memory controller through the third terminal DM.

Various output examples of information Info of the semiconductor memory device 1400 of FIG. 6 will be described below with reference to FIGS. 7A and 7B.

FIGS. 7A and 7B are tables 1410A amd 1410B showing output examples of information through various terminals. Table 1410A of FIG. 7A shows that information is output through a fourth terminal Alert and at least one of a second terminal DQ and a third terminal DM, and Table 1410B FIG. 7B shows that information is output through the second terminal DQ and/or the third terminal DM. According to the example embodiment shown in FIG. 7B, the fourth terminal Alert may be omitted from the semiconductor memory device 1400 of FIG. 6.

Referring to FIG. 7A, information is output through the fourth terminal Alert in Cases 1 and 2. For example, in Case 1 only first information Info_valid indicating whether data is valid is provided to the memory controller through the fourth terminal Alert. In Case 2, in addition to first information Info_uncor, Info_BA, and Info_BF are provided to the memory controller, and the first through fourth information Info_valid, Info_uncor, Info_BA, and Info_BF are provided to the memory controller through the fourth terminal Alert.

In Cases 3 and 4 shown in FIG. 7A, information is output through the fourth terminal Alert and through at least one other terminal. For example, when it is assumed that the first through fourth information Info_valid, Info_uncor, Info_BA, and Info_BF is provided to the memory controller, the first and second information Info_valid and Info_uncor are provided to the memory controller through the fourth terminal Alert, and the third and fourth information Info_BA and Info_BF are provided to the memory controller through at least one of the second terminal DQ and the third terminal DM. Alternatively, in Case 4, the first information Info_valid is provided to the memory controller through the fourth terminal Alert, and the second through fourth information Info_uncor, Info_BA and Info_BF is provided to the memory controller through at least one of the second terminal DQ and the third terminal DM.

FIG. 7B shows that information is output through the second terminal DQ and/or the third terminal DM, and as in Cases 1 and 2, only the first information Info_valid indicating whether data is valid are provided to the memory controller via the second terminal DQ or the third terminal DM.

Alternatively, when it is assumed that the first through fourth information Info_valid, Info_uncor, Info_BA, and Info_BF is provided to the memory controller, as in Case 3, the first information Info_valid is provided to the memory controller via the second terminal DQ, and the second through fourth information Info_uncor, Info_BA and Info_BF are provided to the memory controller through the third terminal DM. Alternatively, the second through fourth information Info_uncor, Info_BA and Info_BF are provided to the memory controller through the second terminal DQ, and the first information Info_valid is provided to the memory controller through the third terminal DM.

Alternatively, as in Cases 5 and 6, only one of the second terminal DQ and the third terminal DM may be used. For example, as in Case 5, the first through fourth information Info_valid, Info_uncor, Info_BA, and Info_BF are provided to the memory controller through the second terminal DQ. In Case 6, the first through fourth information Info_valid, Info_uncor, Info_BA, and Info_BF are provided to the memory controller through the third terminal DM.

The examples shown in FIGS. 7A and 7B are modifiable examples, and information may be provided to the memory controller using other methods. That is, for example, information may be provided through other terminals than the second terminal DQ or the third terminal DM (e.g., a terminal CA illustrated in FIG. 6), or the information may also be provided to the memory controller through other combinations of the second through fourth terminals DQ, DM, and Alert.

Also, when the second terminal DQ through which data is input or output is used, a preamble may be added to a front end of information output through the second terminal DQ. That is, for example, at least one bit value indicating other information than data obtained according to a memory operation may be added to a front end of corresponding information provided through the second terminal DQ.

Figure 8:
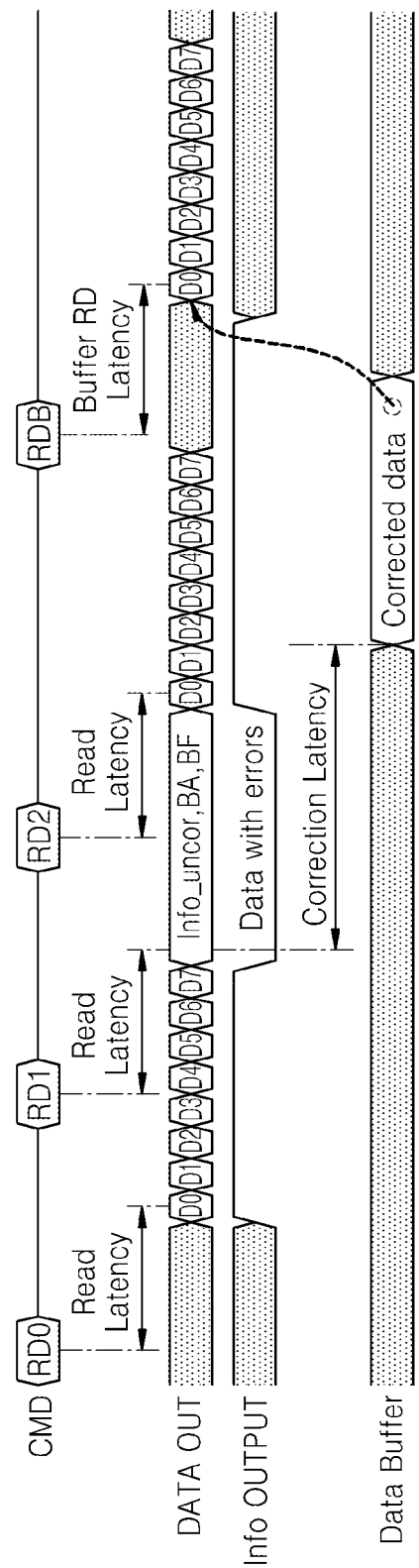
FIG. 8 is a view illustrating an example of a waveform of information provided to a memory controller.

FIG. 8 is a view illustrating an example of a waveform of information provided to a memory controller. It is assumed here that error-corrected data stored in a data buffer is output in response to a buffer read command.

When a first read command RD0 is received, and it is determined that data read in response to the first read command RD0 is valid, data is output after a given, desired or predetermined read latency. Also, together when the data is output, activated first information Info_valid is provided to a memory controller.

When a second read command RD1 is received and it is determined that data read in response to the second read command RD1 is invalid, deactivated first information Info_valid is provided to the memory controller. Also, as valid data is not output from a semiconductor memory device, a data terminal may be used to input or output other signals before data corresponding to a next command is transmitted or received, and other information described above (e.g., second through fourth information Info_uncor, Info_BA, and Info_BF) may be provided to the memory controller through a data input/output terminal. Thereafter, the third read command RD2 is received and data corresponding thereto is output. In response to a received buffer read command RDB, data stored in the data buffer (error-corrected data) is read and provided to the memory controller.

According to at least the above-described example embodiment, when the read data is not valid, the memory controller determines that valid data according to the read command is not yet received by referring to a status of the first information Info_valid. The memory controller may output a command for other memory operation without having to wait for data responding to the read command to be received. After a given, desired or predetermined delay time, the memory controller obtains/receives error-corrected data by outputting a command (e.g., a buffer read command) for accessing data stored in the data buffer (or error-corrected data), and thus, degradation in system performance due to overhead in terms of timing due to time required in correcting errors of a plurality of bits may be reduced.

Figure 9A:
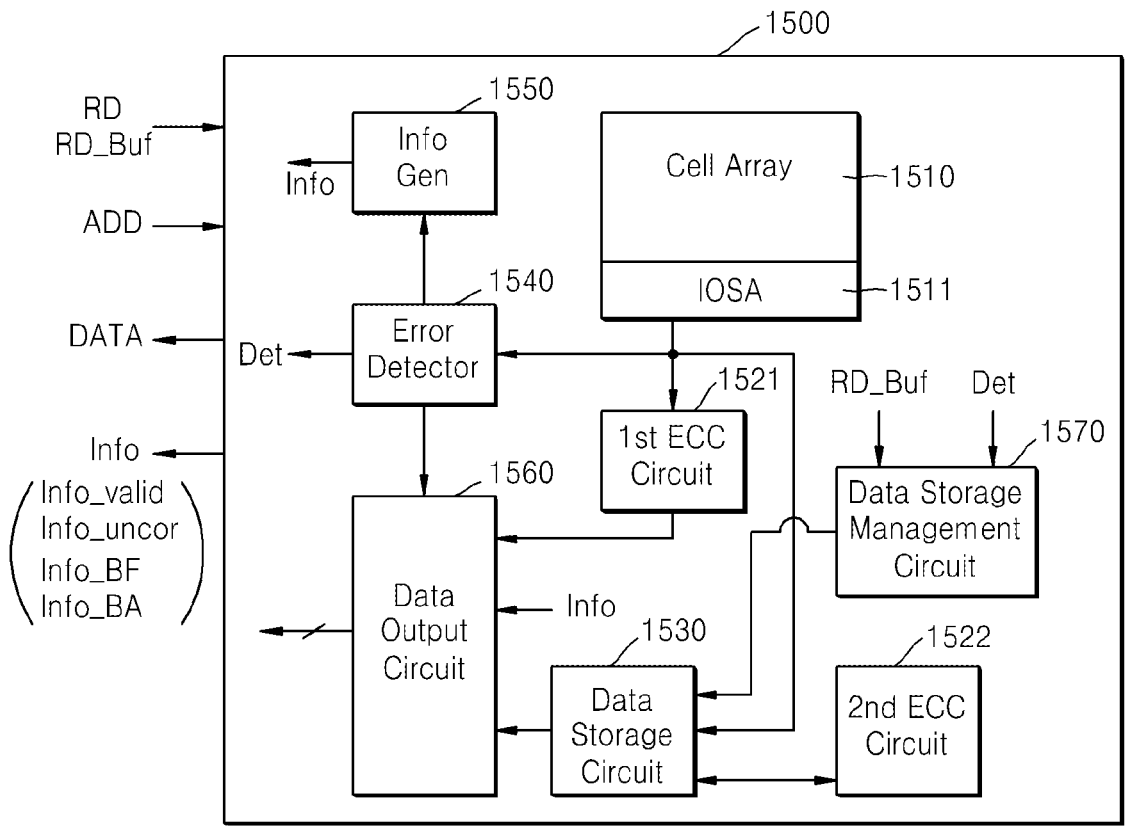
FIG. 9A is a block diagram illustrating a semiconductor memory device according to another example embodiment.
Figure 9B:
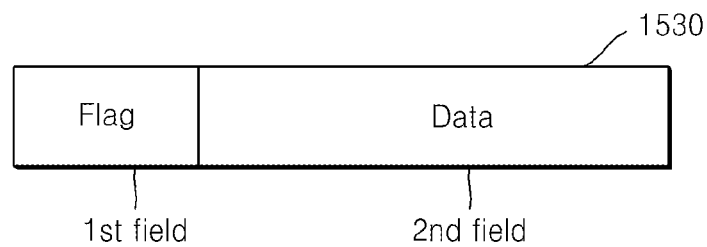
FIG. 9B illustrates an example of storage of information in the data storage circuit 1530 of FIG. 9A.

FIG. 9A is a block diagram illustrating a semiconductor memory device 1500 according to another example embodiment. FIG. 9B illustrates an example embodiment of the data storage circuit 1530. In the semiconductor memory device 1500, a single buffer is applied as a data storage circuit 1530.

As illustrated in FIG. 9A, the semiconductor memory device 1500 includes a cell array 1510, an input/output sense amplifier 1511, first and second ECC circuits 1521 and 1522 (also referred to herein as error correction circuits), the data storage circuit 1530, an error detector 1540, an information generating circuit 1550 (also referred to herein as an error correction status information generating circuit), a data output circuit 1560, and a data storage management circuit 1570. It is assumed here that error correction algorithms capable of correcting different numbers of errors are performed by the first and second ECC circuits 1521 and 1522. For example, the first ECC circuit 1521 may correct one error per error correction unit, and the second ECC circuit 1522 may correct three errors per error correction unit. Also, it is assumed that when one or less error is generated in the read data, it is determined that corresponding data is valid, but when at least two or three errors are generated, it is determined that corresponding data is not valid. Also, when at least four errors are generated in the read data, it is determined that errors of corresponding data are not correctable.

A single buffer is used as the data storage circuit 1530, and data that is read in response to a read command may be stored in the single buffer. The data storage circuit 1530 may include a first field for storing a flag and a second field for storing data. As a result of error detection with respect to the read data, when it is determined that the read data is not valid, the invalid data is stored in the second field of the data storage circuit 1530. Also, a flag indicating that the data storage circuit 1530 is currently in use is stored in the first field of the data storage circuit 1530. For example, invalid data is stored in the data storage circuit 1530, a flag having a first status is stored in the first field. The flag may also be referred to herein as a data storage status indicator.

An operation of storing data including an error in the data storage circuit 1530 may be performed according to a result of detection of the error detector 1540. For example, when read data is valid, an operation of storing the read data in the data storage circuit 1530 is skipped. When the read data is not valid, data including an error is stored in the data storage circuit 1530. To this end, a detection signal Det sent from the error detector 1540 is provided to the data storage management circuit 1570, and the data storage management circuit 1570 selectively stores data in the data storage circuit 1530 according to a status of the detection signal Det.

As a result of error detection, when at least four errors are generated in the read data, the information generating circuit 1550 outputs second information Info_uncor, which indicates that corresponding data includes an uncorrectable error. In this case, the first information Info_valid may be either activated or deactivated. When the second information Info_uncor is activated, the memory controller determines that data accessed in response to a corresponding read command is not usable.

Data determined as valid is provided to the memory controller via the first ECC circuit 1521 and the data output circuit 1560, and according to the above-described example embodiment, first information Info_valid indicating that data is valid is provided to the memory controller. Meanwhile, errors of the data stored in the data storage circuit 1530 are corrected by using the second ECC circuit 1522, and error-corrected data is stored in the data storage circuit 1530.

Upon receiving the first information Info_valid indicating that data accessed in response to a read command is not valid, the memory controller outputs a buffer read command RD_Buf to the semiconductor memory device 1500 after a given, desired or predetermined period of time has passed, in order to obtain data corresponding to the read command. An output timing of the buffer read command RD_Buf may be determined in consideration of time needed for error correction of data, and after receiving the first information Info_valid indicating that data is not valid, the memory controller may output a buffer read command RD_Buf for accessing the data storage circuit 1530 after outputting a command for other memory operations for a given, desired or predetermined number of times.

The semiconductor memory device 1500 outputs data stored in the data storage circuit 1530 to the memory controller in response to a buffer read command RD_Buf. The data storage management circuit 1570 controls the output of data stored in the data storage circuit 1530 in response to a buffer read command RD_Buf. While a buffer read command RD_Buf being provided to the data storage management circuit 1570 is illustrated in FIG. 9A, example embodiments are not limited thereto, and a buffer read command RD_Buf may be decoded by using a command decoder (not shown) in the semiconductor memory device 1500, and a decoded signal may be provided to the data storage management circuit 1570.

After data stored in the data storage circuit 1530 is output, a flag of the first field of the data storage circuit 1530 is altered to have a second status. Whether the data storage circuit 1530 is not in use is determined according to alteration of the flag, and when data accessed in response to other read commands is not valid thereafter, corresponding data may be stored in the data storage circuit 1530. Operations such as storage, reading, and alteration of information regarding the first field and the second field (data and flag) of the data storage circuit 1530 described above may be performed by using the data storage management circuit 1570. However, example embodiments are not limited thereto, and without additionally including the data storage management circuit 1570, operations such as storage, reading, and alteration of the data storage circuit 1530 may be controlled (e.g., directly controlled) by a control signal such as a detection result Det.

Figure 10A:
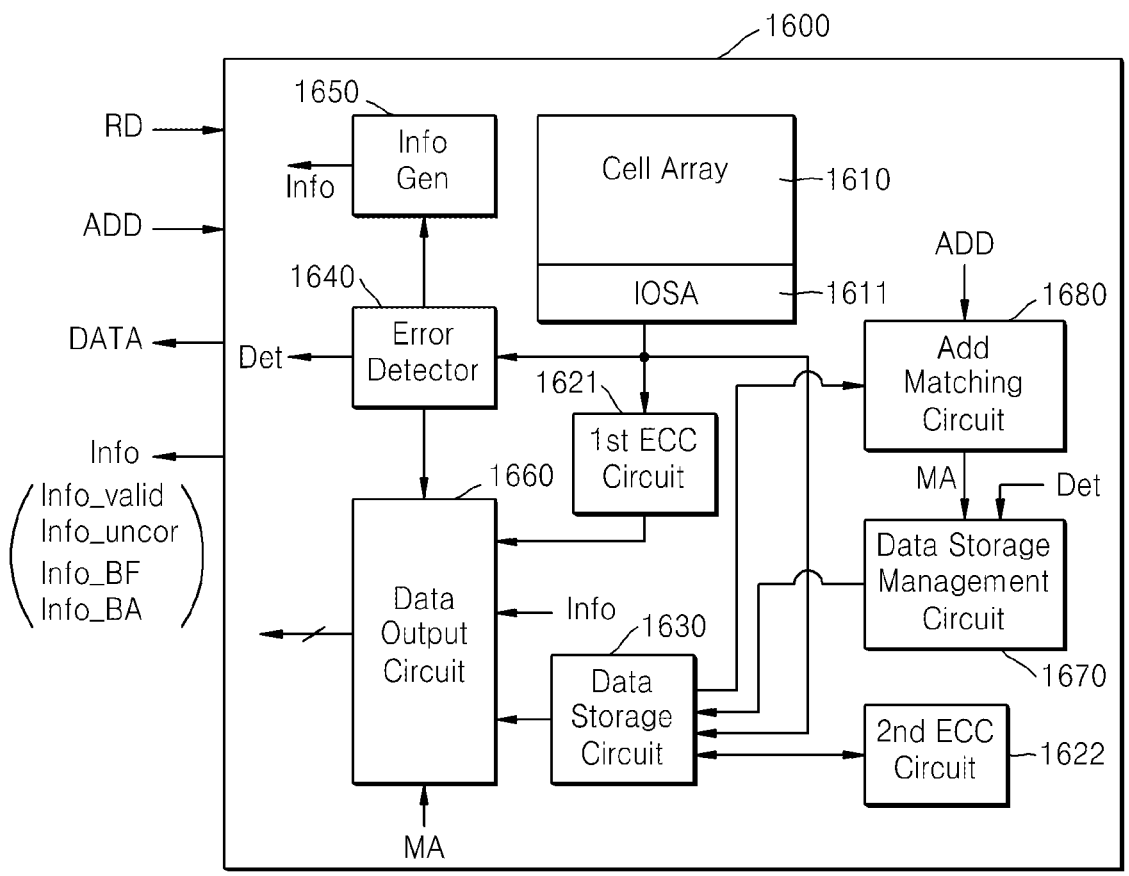
FIG. 10A is a block diagram illustrating a semiconductor memory device according to another example embodiment.
Figure 10B:
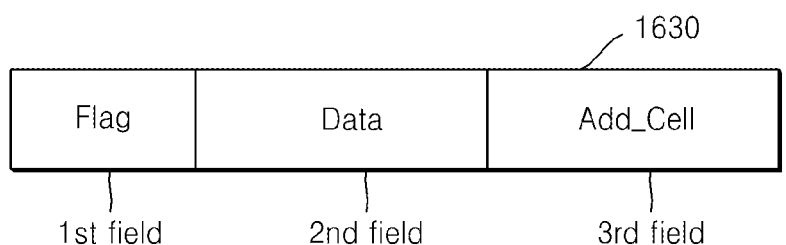
FIG. 10B illustrates an example of storage of information in the data storage circuit 1630 of FIG. 10A.

FIG. 10A is a block diagram illustrating a semiconductor memory device 1600 according to another example embodiment. FIG. 10B illustrates an example embodiment of the data storage circuit 1630 of FIG. 10A. FIG. 10A illustrates an example in which a data storage circuit 1630 is accessed by a typical read command RD, and a single storage circuit is used as the data storage circuit 1630 as in the example embodiment described with reference to FIG. 9A above.

As illustrated in FIG. 10A, the semiconductor memory device 1600 includes a cell array 1610, an input/output sense amplifier 1610, first and second ECC circuits 1612 and 1622, the data storage circuit 1630, an error detector 1640, an information generating circuit 1650 (also referred to herein as an error correction status information generating circuit), a data output circuit 1660, a data storage management circuit 1670, and an address matching circuit 1680.

Referring to FIGS. 10A and 10B, the data storage circuit 1630 includes a single buffer, and the single buffer includes a first field for storing a flag, a second field for storing data, and a third field for storing address information of data. When it is detected that data read in response to a read command is not valid, data including an error is stored in the second field of the data storage circuit 1630, a flag having a first status is stored in the first field, and address information ADD_cell representing a position on the cell array 1610 corresponding to the data stored in the second field is stored in the third field. Errors of the data stored in the second field of the data storage circuit 1630 are corrected by using the second ECC circuit 1622.

Upon receiving first information Info_valid indicating that data accessed in response to a first read command RD is not valid, the memory controller outputs a read command one more time (e.g., a second read command RD) to the semiconductor memory device 1600 after a given, desired or predetermined period of time has passed in order to obtain data corresponding to the read command. Also, an address ADD of data to be accessed data is also provided to the semiconductor memory device 1600 together with the second read command RD. Hereinafter, an address provided together with the second read command RD will be referred to as a read address ADD.

The address matching circuit 1680 compares the received read address ADD and address information ADD_cell stored in the data storage circuit 1630 to determine whether they match. When the read address ADD and the address information ADD_cell stored in the data storage circuit 1630 match, the data storage management circuit 1670 controls error-corrected data stored in the data storage circuit 1630 to be accessed in response to a matching signal MA. The accessed is provided to the data output circuit 1660, and the data output circuit 1660 outputs the data sent from the data storage circuit 1630 to the memory controller in response to the matching signal MA On the other hand, when the read address and the address information ADD_cell stored in the data storage circuit 1630 are different, a request for accessing memory cells at other positions of the cell array 1610 may have been intended. In this case, the data read from the cell array 1610 may be provided to the memory controller in the above-described process (e.g., error detection and information provision).

When the read address and the address information ADD_cell stored in the data storage circuit 1630 match and data stored in the data storage circuit 1630 is output, a flag stored in the data storage circuit 1630 is changed into a second status and the data storage circuit 1630 returns to an available status. Alternatively, the flag may maintain a first status regardless of the comparison result, and when other read commands RD are received thereafter, read addresses accompanying the read command RD may again be compared with address information ADD_cell stored in the data storage circuit 1630. According to a comparison result, data read from the cell array 1610 may be provided to the memory controller through the above-described error detection process, or data that is stored already in the data storage circuit 1630 (error-corrected data) may be provided to the memory controller.

Figure 11A:
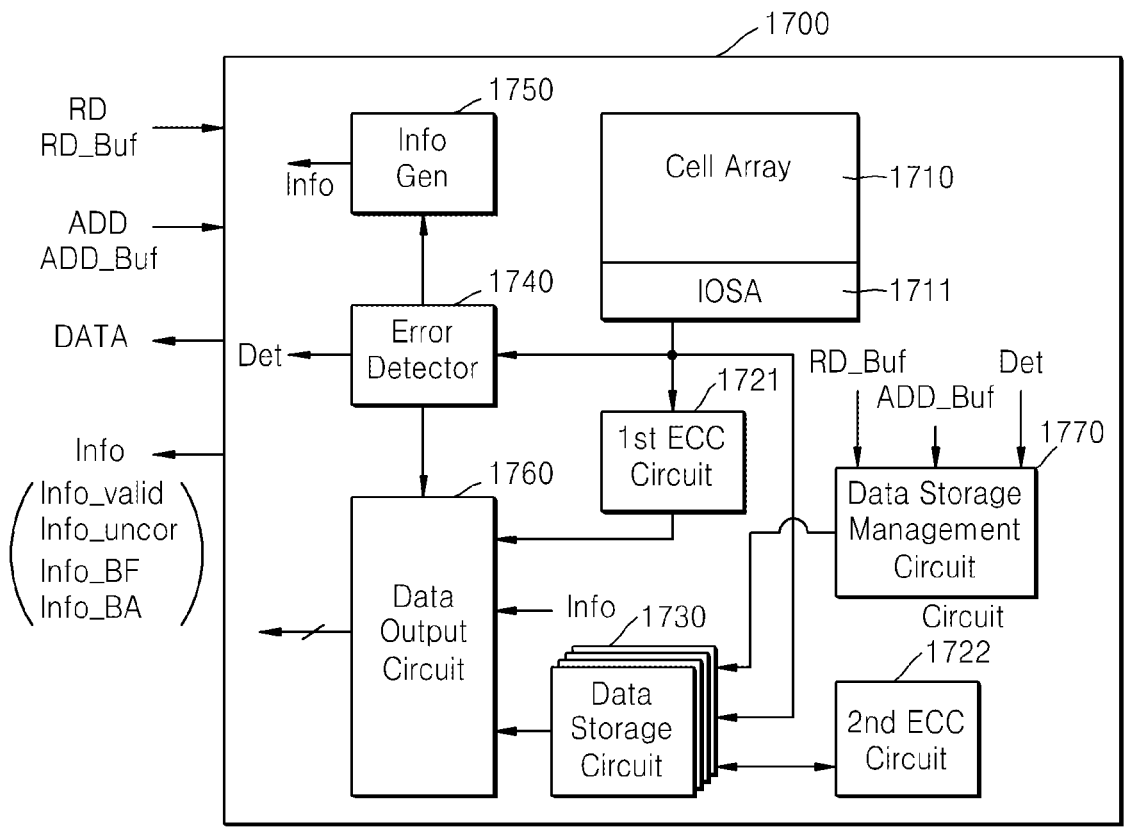
FIG. 11A is a block diagram illustrating a semiconductor memory device according to another example embodiment.
Figure 11B:
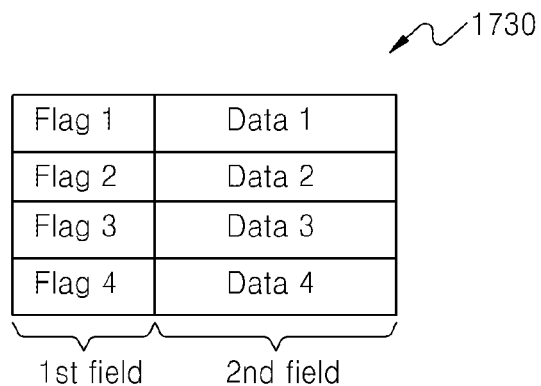
FIG. 11B illustrates an example of storage of information in the data storage circuit 1730 of FIG. 11A.

FIG. 11A is a block diagram illustrating a semiconductor memory device 1700 according to another example embodiment. Unlike the semiconductor memory device 1500 of FIG. 9A, a data storage circuit 1730 of the semiconductor memory device 1700 includes a plurality of buffers. FIG. 11B illustrates an example embodiment of the data storage circuit 1730. Structures and operations of the semiconductor memory device 1700 of FIG. 11A that are the same or substantially the same as structures and operations of the semiconductor memory devices of example embodiments described above will not be repeated.

As illustrated in FIG. 11A, the semiconductor memory device 1700 includes a cell array 1710, an input/output sense amplifier 1711, first and second ECC circuits 1721 and 1722, a data storage circuit 1730, an error detector 1740, an information generating circuit 1750 (also referred to herein as an error correction status information generating circuit), a data output circuit 1760, and a data storage management circuit 1770.

The data storage circuit 1730 includes a plurality of buffers (or a plurality of data buffers), and each buffer may have the same or substantially the same structure as the single buffer illustrated in FIG. 9A. In FIGS. 11A and 11B, the data storage circuit 1730 including four buffers is illustrated as an example.

When data accessed in response to the read command RD is not valid, corresponding data is stored in one selected buffer of first through fourth buffers, and a flag of a first field of the selected buffer is changed into a first status. Also, the plurality of buffers are distinguished by a buffer address ADD_Buf, and buffer address information corresponding to the selected buffer is provided to the memory controller together with information indicating that data is not valid. An operation of selecting a buffer may be performed in various ways. For example, a flag of a first field of the first through fourth buffers may be detected, and then at least one buffer (available buffers) in which the flag of the first field has a second status may be detected, and one of the available buffers may be selected.

In one example, when a second buffer is selected, the memory controller outputs buffer address ADD_Buf indicating a buffer that is to be accessed, together with a buffer read command RD_Buf for accessing the data storage circuit 1730. The semiconductor memory device 1700 may output data stored in any one of the buffers (e.g., error-corrected data) to the memory controller in response to the buffer read command RD_Buf and the buffer address ADD_Buf. As in the above-described example embodiments, output of data stored in the data storage circuit 1730 is controlled by using the data storage management circuit 1770, and after error-corrected data of the second buffer is output to the memory controller, a flag of the second buffer may be changed to a second status.

Alternatively, even after the data stored in the data storage circuit 1730 is output to the memory controller, the flag may maintain its status (e.g., a first status). In this example, every time a read operation is performed, correction of multi-bit errors need not be repeatedly performed, but rather the error-corrected data may be further stored in the data storage circuit 1730. When data at a corresponding position is to be accessed, the memory controller outputs a buffer read command RD_Buf and a buffer address ADD_Buf to thereby receive previously existing error-corrected data. Thereafter, when, for example, data at a corresponding position of the cell array 1710 is changed according to a write command, a corresponding buffer may be changed into an available status by changing a status of a flag stored in the data storage circuit 1730 into a second status.

Figures 12A, 12B:
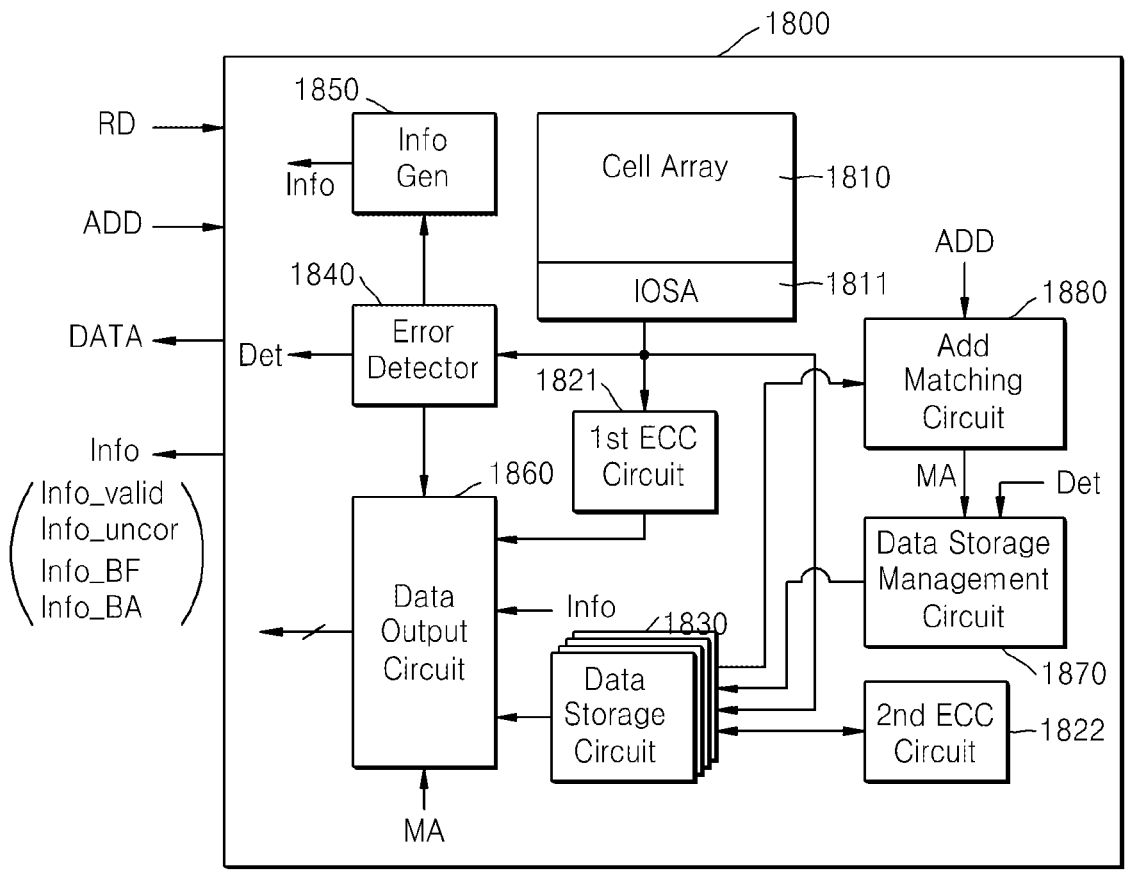
FIG. 12A is a block diagram illustrating a semiconductor memory device according to another example embodiment.
FIG. 12B illustrates an example of storage of information in the data storage circuit 1830 of FIG. 12A.

FIG. 12A is a block diagram illustrating a semiconductor memory device 1800 according to another example embodiment. Unlike the semiconductor memory device 1600 of FIG. 10A, a data storage circuit 1830 of the semiconductor memory device 1800 includes a plurality of buffers. FIG. 12B illustrates an example embodiment of the data storage circuit 1830.

As illustrated in FIG. 12A, the semiconductor memory device 1800 includes a cell array 1810, an input/output sense amplifier 1811, first and second ECC circuits 1821 and 1822, the data storage circuit 1830, an error detector 1840, an information generating circuit 1850 (also referred to herein as an error correction status information generating circuit), a data output circuit 1860, a data storage management circuit 1870, and an address matching circuit 1880.

Referring to FIGS. 12A and 12B, the data storage circuit 1830 includes first through fourth buffers, and each buffer includes a first field for storing a flag, a second field for storing data, and a third field for storing address information of data. When data detected as invalid is stored in the second buffer, a flag having a first status is stored in the first field of the second buffer, and address information ADD_cell 1 through ADD_cell 4 corresponding to the data is stored in the third field of the second buffer. Errors of the data stored in the data storage circuit 1830 are corrected by using the second ECC circuit 1822.

The memory controller outputs, to the semiconductor memory device 1800, an address of data (hereinafter referred as read address ADD) to be accessed with the read command RD. The address matching circuit 1880 compares the received read address ADD and address information ADD_cell 1 through ADD_cell 4 stored in the data storage circuit 1830 to determine whether the received address ADD is the same as (matches) any of the address information ADD_cell 1 through ADD_cell 4. As a result of the comparison, data of a buffer having the same address information as the read address (error-corrected data) is provided to a memory controller.

The matching operation may be performed in various ways; for example, from among the first through fourth buffers, address information of a buffer whose flag of the first field has a first status (a status in use) may be loaded to the address matching circuit 1880, and the loaded address information and the read address may be compared to perform a matching operation. If all of flags of first fields of the first through fourth buffers do not have a first status, data of the cell array 1810 corresponding to the read address ADD may be read without any additional address matching operation.

As in the above-described example embodiment, when error-corrected data is output from the data storage circuit 1830, a flag corresponding thereto may be changed into a second status. For example, as the error-corrected data stored in the second buffer is output by a typical read command or a buffer read command, a flag of a first field of the second buffer may be changed into a second status so that the second buffer is in an available status.

Alternatively, when a flag of the first field of the second buffer maintains a first status, and then a read address ADD that is the same as address information stored in the second buffer is received together with the read command RD, error-corrected data stored in the second buffer may be provided to the memory controller in accordance with the read command RD. In this case, repetition of unnecessary error-correction operations that may occur when the same region of the cell array 1810 is accessed may be suppressed and/or prevented, and when address comparison is conducted, error-corrected data stored in the data storage circuit 1830 may be output to the memory controller. Then, when data is written to a region of the cell array 1810 corresponding to the address information stored in the second buffer, a flag of the first field of the second buffer may be changed into a second status, and the second buffer may be converted into an available status accordingly.

Alternatively, when all buffers included in the data storage circuit 1830 are in an available status, a flag of a first field of at least one buffer may be changed to a second status. For example, from among data stored in the first through fourth buffers of the data storage circuit 1830, when data of at least one buffer is provided to the memory controller according to a read command or a buffer read command, a flag of a first field of the at least one buffer may be changed to a second status so that a corresponding buffer is in an available status. Here, if data of at least two buffers is output already, a flag of which buffer is to be altered may be selected as desired, and a flag may be altered according to the order in which the buffers are used.

Figure 13:
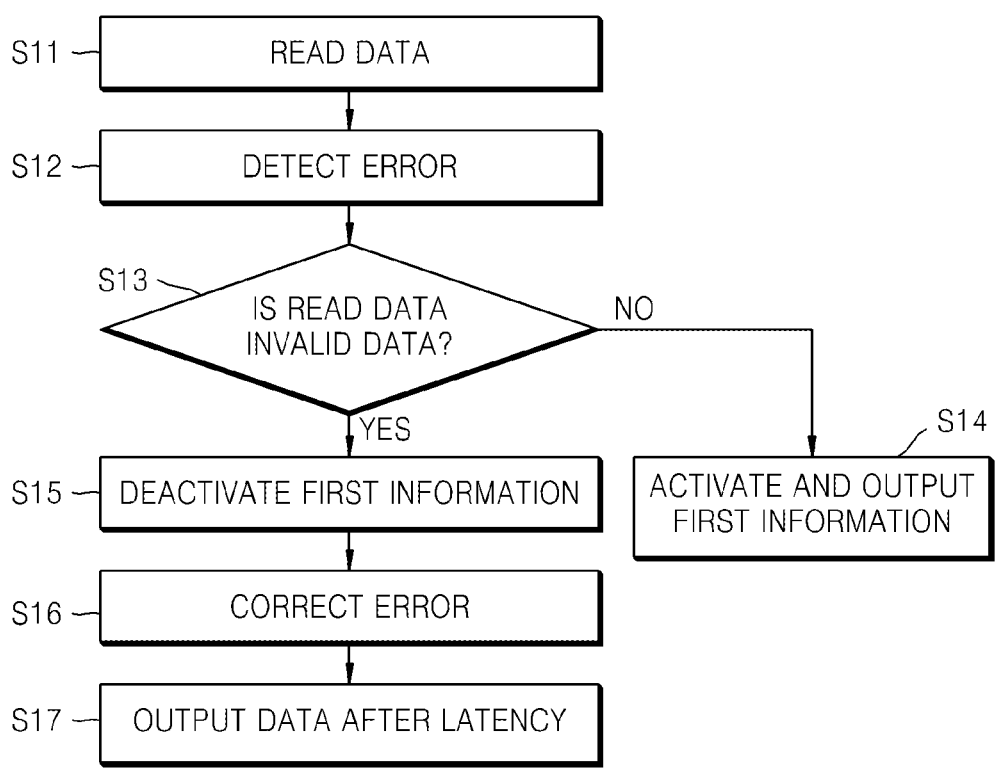
FIG. 13 is a flowchart illustrating a method of operating a semiconductor memory device according to an example embodiment.

FIG. 13 is a flowchart illustrating a method of operating a semiconductor memory device according to an example embodiment.

As illustrated in FIG. 13, in operation S11, data of a cell array of the semiconductor memory device is read in response to a read command sent from a memory controller. Error detection is performed in error correction circuits with respect to the read data in operation S12, and the number of errors generated in data in error correction circuits is detected. In operation S13, according to a result of the error detection, whether the read data is valid data or not is determined.

Regarding invalid data, errors thereof may be corrected by using an error corrector for correcting an error of at least two bits included in the semiconductor memory device (e.g., a first error corrector). As a result of the determination, when the number of errors is less than or equal to a previously set value, the data is determined as valid and the read data is output to the memory controller in operation S14. Also, together when the data is output, first information indicating that the data is valid is activated and output.

If no error is generated and the data is determined as valid data, then the read data is output without additional error correction operation. When one or less errors are generated in data in error correction circuits, the data is determined as valid data. When the read data is valid and one error exists, the error is corrected by using an additional 1 bit-error corrector included in the semiconductor memory device (e.g., a second error corrector), and error-corrected data is output to the memory controller.

When the number of errors exceeds a previously set value, the data is determined as invalid, and the semiconductor memory device outputs deactivated first information indicating that the read data is invalid to the memory controller in operation S15. Errors of the invalid data are corrected by using an additional error corrector included in the semiconductor memory device (e.g., an error corrector that corrects errors of two bits or more) in operation S16. According to at least this example embodiment, as the error of the data is corrected, the error-corrected data is output without any additional command input, and the data is output in operation S17 immediately after the error is corrected or after a given, desired or predetermined latency (e.g., an error correction latency).

Figure 14:
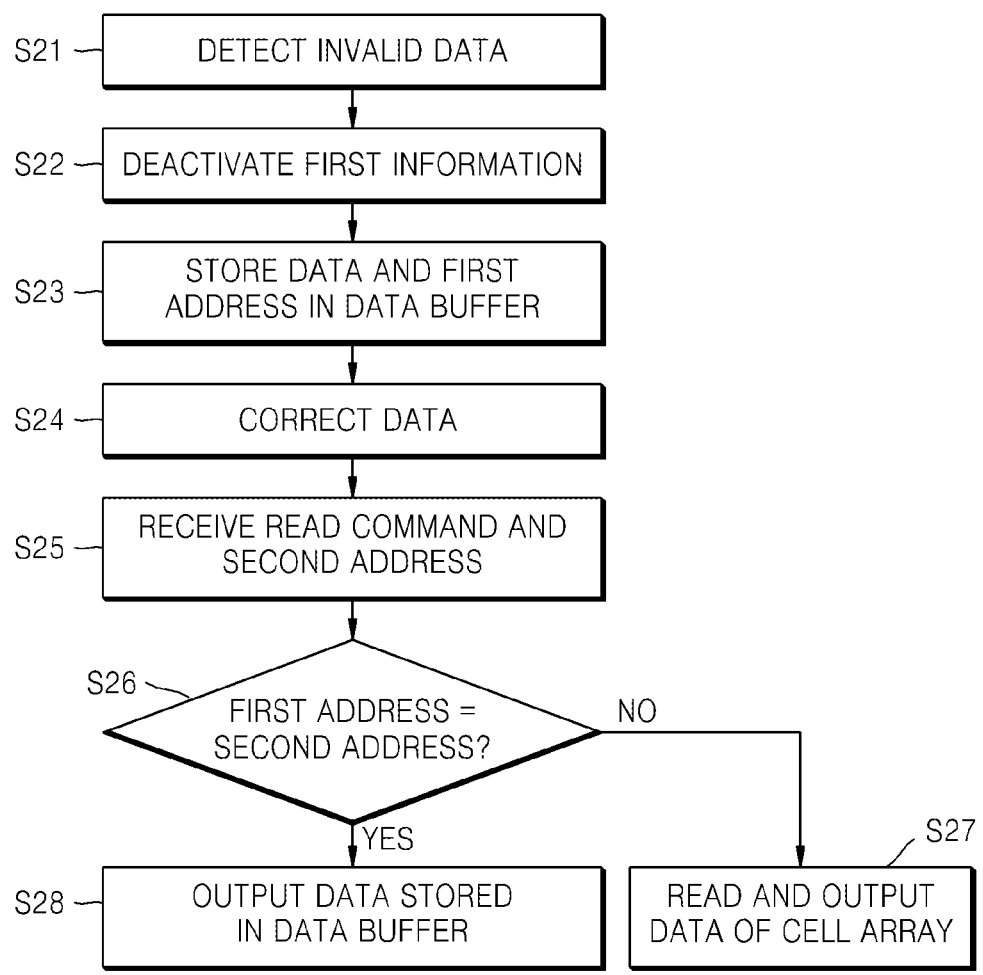
FIG. 14 is a flowchart illustrating a method of operating a semiconductor memory device according to another example embodiment.

FIG. 14 is a flowchart illustrating a method of operating a semiconductor memory device according to another example embodiment. Hereinafter, it is assumed that read data is not valid. Also, FIG. 14 shows an example where a typical read command is used to access error-corrected data stored in a data buffer.

Referring to FIG. 14, in operation S21, data that is read in response to a first read command is detected as invalid, and first information indicating whether the data is valid or not is deactivated and provided to a memory controller in operation S22. Also, invalid data that includes an error is stored in the data buffer, and address information corresponding to the invalid data (hereinafter, a first address) is also stored in the data buffer in operation S23. An error correction operation with respect to the data stored in the data buffer is performed in operation S24.

Upon receiving the deactivated first information, the memory controller determines that appropriate data corresponding to the first read command is not received, and outputs a command for performing another memory operation without having to wait for the data to be received. Then, after a given, desired or predetermined period of time or a (e.g., previously set) delay time, the memory controller outputs a second read command and a second address to access data stored in the data buffer of the semiconductor memory device.

In operation S25, the semiconductor memory device receives the second read command and the second address, and in operation S26 compares the first address stored in the data buffer with the second address received from the memory controller. As a result of comparison, if the two addresses do not match with each other, then data corresponding to the second address is read from the cell array and output to the memory controller in operation S27. If the two addresses match with each other as a result of comparison, then the data stored in the data buffer is read and output to the memory controller in operation S28.

Figure 15:
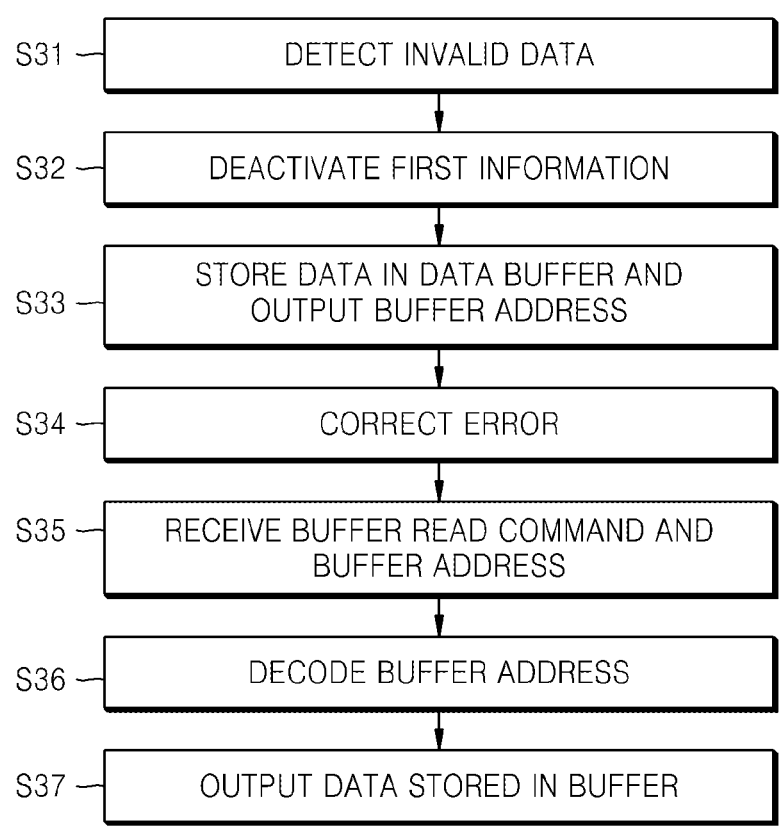
FIG. 15 is a flowchart illustrating a method of operating a semiconductor memory device according to another example embodiment.

FIG. 15 is a flowchart illustrating a method of operating a semiconductor memory device according to another example embodiment.

Referring to FIG. 15, a buffer read command is used to access error-corrected data stored in a data buffer, and the data buffer includes a plurality of buffers.

In operation S31, data that is read in response to a first read command is detected as invalid, and first information indicating whether the data is valid or not is deactivated and provided to a memory controller in operation S32. Also, invalid data including an error is stored in the data buffer, and address information (buffer address) of a buffer in which the invalid data is stored is output to the memory controller in operation S33. Also, error correction with respect to the data stored in the data buffer is performed in operation S34.

In operation S35, upon receiving the deactivated first information, the memory controller outputs a buffer read command and a buffer address as signals for accessing data stored in the data buffer of the semiconductor memory device after a given, desired or predetermined period of time or a (e.g., previously set) delay time.

In operation S36, the memory device selects a buffer to be accessed from among the plurality of buffers by decoding the buffer address.

In operation S37, data stored in a buffer corresponding to the buffer address is read and output to the memory controller.

In FIG. 15, address information of a buffer in which invalid data is stored is output, as the data buffer includes a plurality of buffers, and the buffer address is provided by the memory controller when the data buffer is accessed. However, when the data buffer includes a single buffer, transmission and reception of the buffer address information may be omitted.

Figure 16:
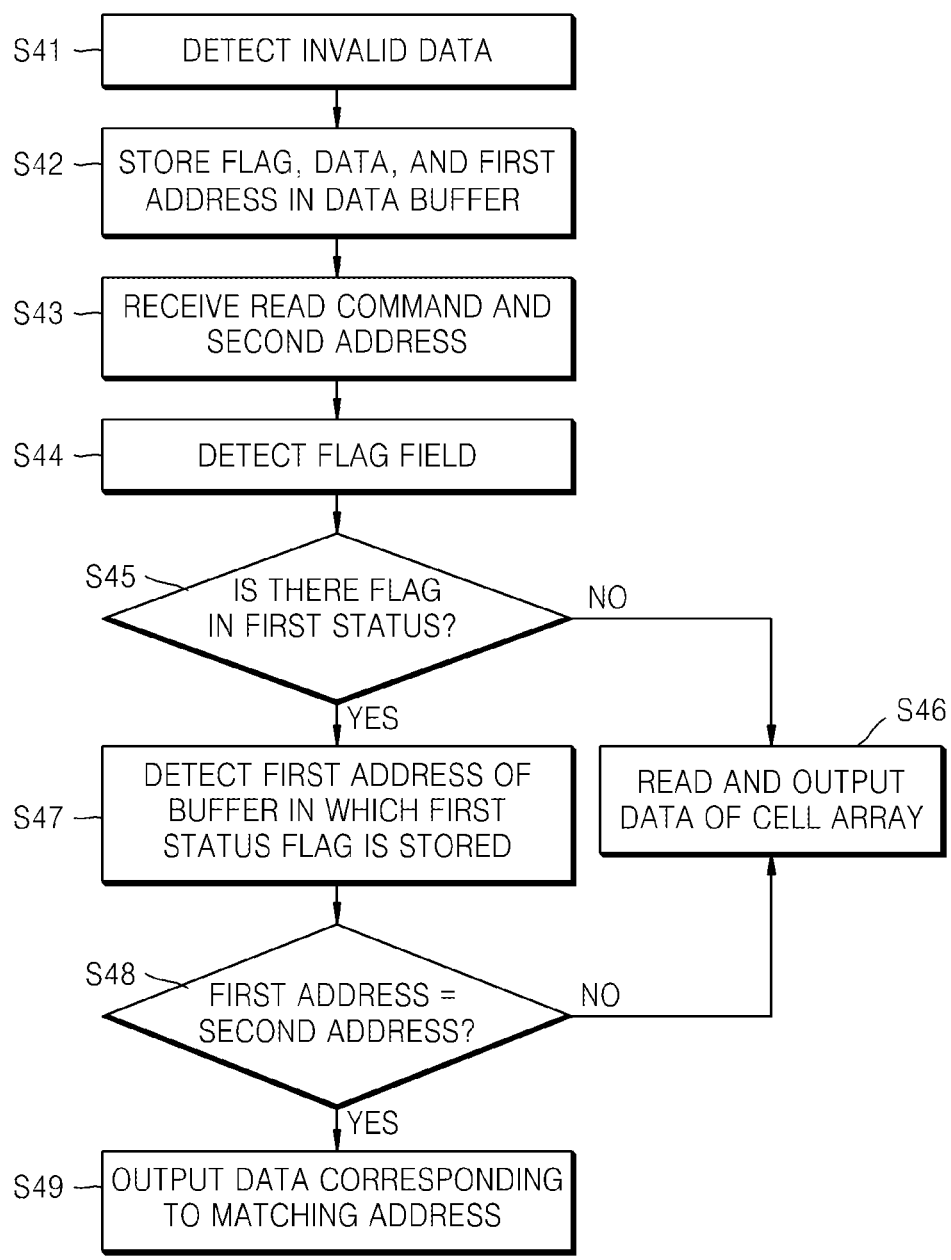
FIG. 16 is a flowchart illustrating a method of operating a semiconductor memory device according to another example embodiment.

FIG. 16 is a flowchart illustrating a method of operating a semiconductor memory device according to another example embodiment. In FIG. 16, error-corrected data stored in a plurality of buffers is accessed by using a typical or conventional read command.

In operation S41, data that is read in response to a read command is detected as invalid, and information indicating that the data is invalid is provided to a memory controller. The invalid data is stored in an available buffer from among a plurality of buffers (e.g., a first buffer). Address information of a cell array where the data is accessed (hereinafter, first address) and a flag indicating that the first buffer is currently in a status of use (e.g., a flag in a first status) are also stored in the first buffer in operation S42.

Then, a second read command and a second address are received from the memory controller in operation S43. In response to reception of the second read command, a status of a flag stored in first fields of the buffers (e.g., a flag field) is detected in operation S44. According to a result of detection, whether there is a buffer having a flag in a first status from among the plurality of buffers is determined in operation S45.

If there is no flag in a first status, then data corresponding to the second address is read from the cell array and output in operation S46. In regard to read data, error detection, output of information indicating whether data is valid, and error correction is then performed.

If there is a flag in a first status, then a first address stored in buffers having a flag in a first status is detected in operation S47, and at least one detected first address is compared with the received second address to generate a matching result in operation S48. When the first and second addresses do not match with each other, data corresponding to the second address is read from the cell array and output in operation S46. On the other hand, when the first and second addresses match with each other, it is determined that a second read command is a command for accessing data stored in the data buffer (error-corrected data), and data of a buffer in which the matching first address is stored is read and output to the memory controller in operation S49.

Figure 17:
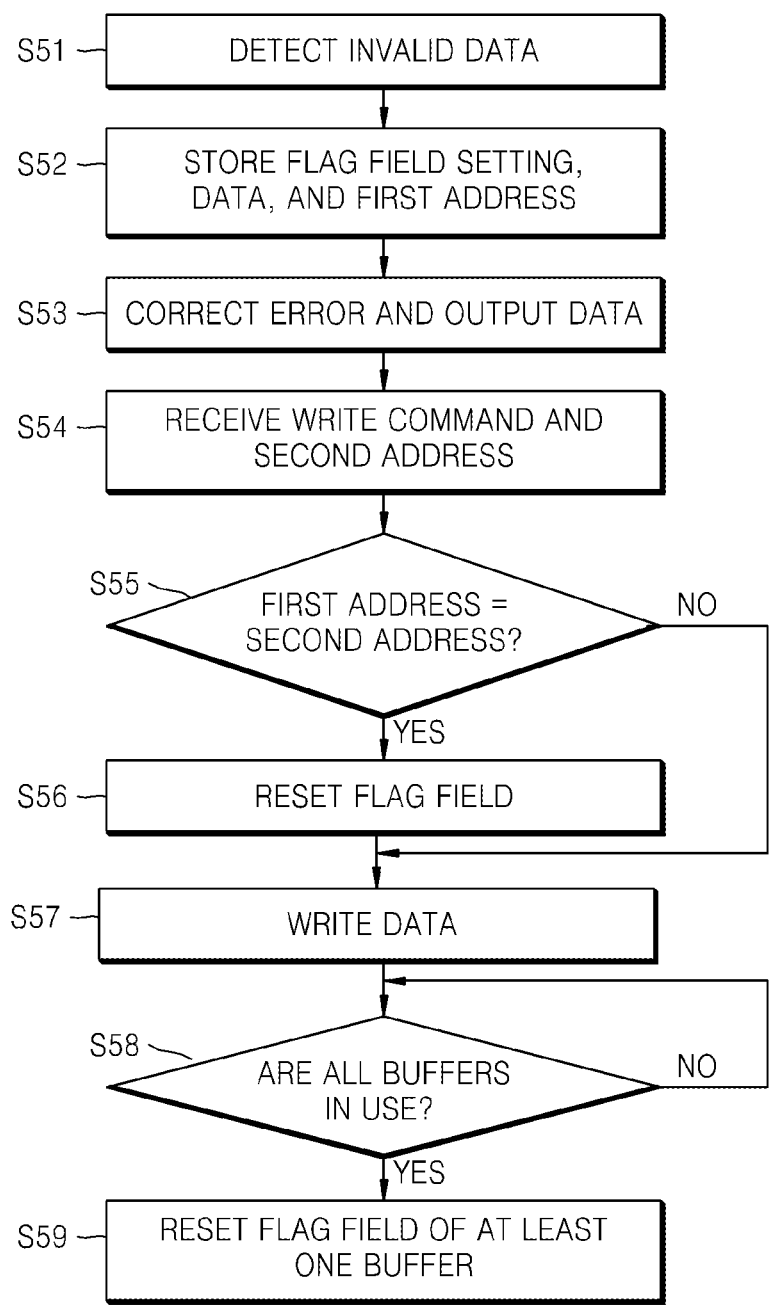
FIG. 17 is a flowchart illustrating a method of operating a semiconductor memory device according to another example embodiment.
Figure 18:
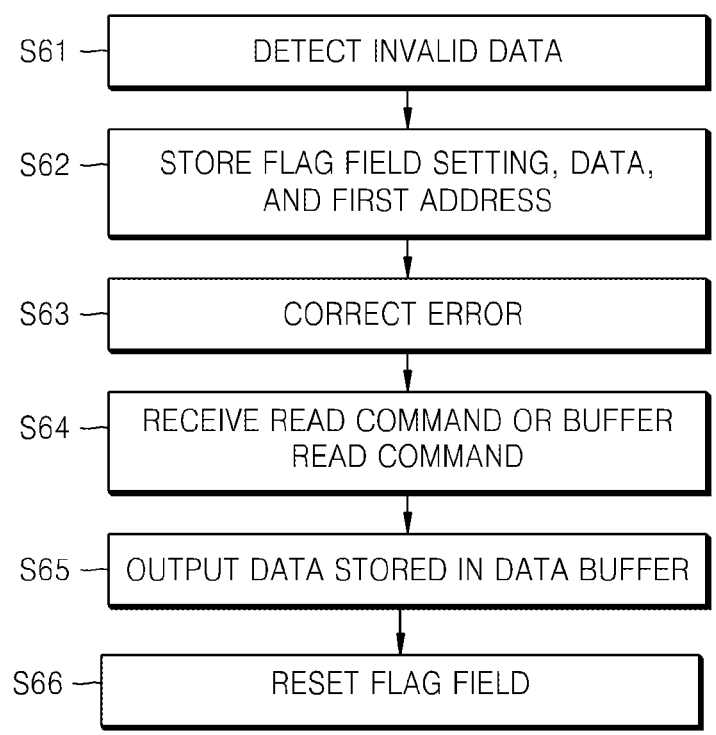
FIG. 18 is a flowchart illustrating a method of operating a semiconductor memory device according to another example embodiment.

FIGS. 17 and 18 are flowcharts illustrating methods of operating semiconductor memory devices according to other example embodiments. FIG. 17 illustrates an example embodiment in which a status of a flag is controlled in response to a data write operation, and FIG. 18 illustrates an example embodiment in which a status of a flag is controlled in response to an output operation of a data buffer.

As illustrated in FIG. 17, in operation S51, data that is read in response to a read command is detected as invalid, and information indicating that the data is not valid is provided to a memory controller. Also, invalid data and a first address corresponding thereto are stored in a data buffer, and a flag field of the data buffer is set in operation S52. Setting of the flag field is performed to indicate that a corresponding data buffer is currently in use, and may be conducted by changing the flag into a first status. While a single buffer is used as the data buffer as described above, if the data buffer includes a plurality of buffers, the buffers in which a flag in a second status is currently stored may be selected, and a flag of the selected buffer may also be set when data is stored in the selected buffers. Error correction operations are performed with respect to data stored in the data buffer, and error-corrected data is output to the memory controller in operation S53.

In operation S54, a second address is received along with a write command. In order to determine whether a region of a cell array for which a data write operation is requested is a region where data has already been read and whether the data is stored in a data buffer, the first address and the second address are compared in operation S55. According to the comparison, whether the first and second addresses are the same may be determined. When the first and second addresses match with each other as a result of the comparing the first and second addresses, a flag field of the data buffer is reset in operation S56, and a data write operation to a region of the cell array corresponding to the second address is performed in operation S57. On the other hand, when the first and second addresses do not match with each other, a data write operation to a region of the cell array corresponding to the second address is performed without resetting a flag field in operation S57.

When a plurality of buffers are included in the semiconductor memory device, a setting status of a flag is maintained before a data write operation to the same region of the cell array is performed, and thus, all of the plurality of buffers may be in a status of use. In this case, whether all of the plurality of buffers are currently in use is determined in operation S58, and if there is an available buffer, then the above determination operations are repeated continuously or periodically. If there is no available buffer to store next invalid data, a flag field of at least one buffer is reset in operation S59. Selection of a buffer to be reset may be performed in various ways, and at least one buffer in which data is stored the first time in terms of the order of data storage from among the buffers from which valid data is output at least once may be selected.

As illustrated in FIG. 18, in operation S61, data that is read in response to a read command is detected as invalid, and information indicating that data is not valid is provided to the memory controller. Also, in operation S62, invalid data and an address corresponding thereto are stored in a data buffer, and a flag field of the data buffer is set. Also, an error of data stored in the data buffer is corrected in operation S63.

In operation S64, a read command or a buffer read command for accessing error-corrected data stored in the data buffer is received. When a buffer read command is used in accessing a data buffer, address information corresponding to the data stored in the data buffer may not be stored. If the data buffer includes a plurality of buffers in addition to the fact that a buffer read command is used, then a buffer address may be further received with the buffer read command.

In operation S65, the data stored in the data buffer is output to the memory controller in response to the read command or the buffer read command. When a read command is used, an address accompanying the read command and address information stored in the data buffer are compared, and data stored in the data buffer may be output according to a result of the comparison. When the error-corrected data stored in the data buffer is read as described above, this indicates that an operation of outputting the read data in order to request the error-corrected data is completed, and thus, the flag field of the data buffer is reset in operation S66.

While not shown in the examples described with regard to methods of operating semiconductor memory devices, other various example embodiments described above may be applied to methods of operating semiconductor memory devices. For example, when errors exceeding a given, desired or predetermined number are generated as a result of error detection, information indicating that uncorrectable errors are generated may be output to the memory controller. Also, various types of information, for example, information indicating whether data is valid, information indicating that uncorrectable error is generated, information related to a buffer address, and information indicating that all buffers are currently in a status of use, may be output to the memory controller through a given, desired or predetermined pin of the semiconductor memory device.

Figure 19:
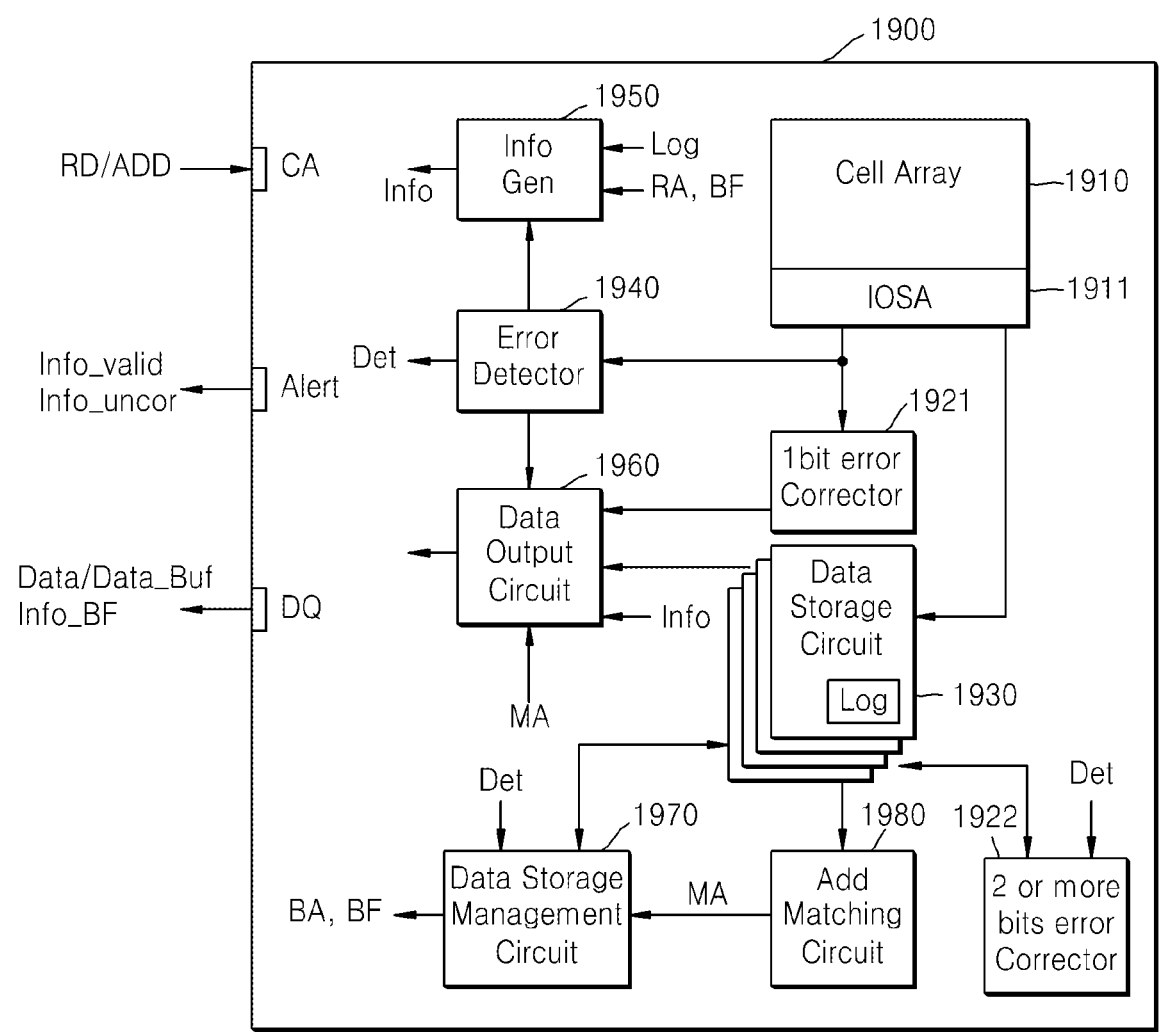
FIG. 19 is a block diagram illustrating a semiconductor memory device according to another example embodiment.

FIG. 19 is a flowchart illustrating a semiconductor memory device 1900 according to another example embodiment. Here, a detailed operation conducted inside the semiconductor memory device is illustrated.

As illustrated in FIG. 19, the semiconductor memory device 1900 includes a cell array 1910, an input/output sense amplifier 1911, first and second ECC circuits 1921 and 1922, a data storage circuit 1930, an error detector 1940, an information generating circuit 1950, a data storage management circuit 1970, and an address matching circuit 1980. The first ECC circuit 1921 corresponds to an error corrector that is capable of correcting an error of 1 bit per error correction unit. In one example, the first ECC circuit 1921 may correct an error by using an ECC algorithm by using a Hamming code. The second ECC circuit 1922 may correspond to an error corrector capable of correcting an error of at least 2 bits per error correction unit, and may correct an error by using, for example, a Viterbi algorithm.

While not illustrated in FIG. 19, when error that exceeds the error correcting capability of the second ECC circuit 1922 is generated, information indicating that uncorrectable error is generated may be output to a memory controller. For example, when the second ECC circuit 1922 may correct an error up to 3 bits per error correction unit, and error of 4 bits or more is detected as a result of error detection, information indicating that uncorrectable error may be generated and output to the memory controller.

The data storage circuit 1930 includes a plurality of buffers, and error-corrected data stored in the data storage circuit 1930 is accessed according to a read command RD. Also, various types of information are provided to the memory controller via a first terminal Alert, which is added in the semiconductor memory device 1900 to transmit information and a second terminal DQ through which data is input and output.

In response to a received first read command RD and a first address ADD, data of the cell array 1910 is accessed, and read data is provided to the error detector 1940. The error detector 1940 generates an error detection result Det, and the information generating circuit 1950 outputs first information Info_valid indicating whether data is valid, through the first terminal Alert in response to the error detection result Det. If the number of errors per error correction circuit is less than 1, then the first information Info_valid indicating that the data is valid is output. Also, when one error is generated in the read data, the error is corrected by using the first ECC circuit 1921, and the error corrected data is provided to the memory controller by using the data output circuit 1960.

When the number of errors per error correction circuit is two or three, the information generating circuit 1950 outputs first information Info_valid indicating that the data is not valid through the first terminal Alert in response to an error detection result Det. The error detection result Det is provided to the data storage management circuit 1970 and the second ECC circuit 1922, and the data storage management circuit 1970 manages storage of the read data in the data storage circuit 1930. To store data, a status of a flag in each of the plurality of buffers of the data storage circuit 1930 is checked, and data may be stored in any available buffer. Together when the data is stored, a first address corresponding to the data is also stored in the data storage circuit 1930.

Alternatively, as invalid data is further read in response to continuous read commands, all of the buffers of the data storage circuit 1930 may be in a status of use. In this case, when data read in response to subsequent read commands is not valid, the data storage management circuit 1970 notifies the information generating circuit 1950 that all buffers are in use, and the information generating circuit 1950 provides information Info_BF indicating that all buffers are in use to the memory controller via a second terminal DQ. When the memory controller receives the information Info_BF, whether valid data may be received or not in response to a corresponding read command RD is determined.

Errors in data that is stored in the data storage circuit 1930 may be corrected by using the second ECC circuit 1922. Each buffer included in the data storage circuit 1930 may store a log value Log indicating an error correction status of data. For example, information indicating that error correction with respect to data of a corresponding buffer, information indicating that error correction is impossible, or a log value Log indicating that error correction is currently being performed may be stored. The log value Log as described above may be provided to the information generating circuit 1950, and when a request for accessing data stored in the data storage circuit 1930 is received from the memory controller, the information generating circuit 1950 may generate additional information by referring to the log value Log and provide the same to the memory controller.

For example, when a request for accessing the data is made after error correction of the data stored in the data storage circuit 1930 is completed, information indicating that the data is valid may be output with the error-corrected data. On the other hand, when error correction of the data stored in the data storage circuit 1930 has failed, information indicating that error correction has failed may be output by referring to a log value. Also, by referring to a log value, information indicating that error correction is currently in process may be output to the memory controller.

When a second read command RD and a second address ADD are received to access the data storage circuit 1930, the address matching circuit 1980 matches the first address ADD and the received second address ADD stored in the data storage circuit 1930 and generates a matching result MA. According to a result of the matching, when the first and second addresses ADD are different, data DATA of the cell array 1910 is read and output. When the first and second addresses ADD are the same, the data read from the data storage circuit 1930 DATA_Buf is output.

Figure 20:
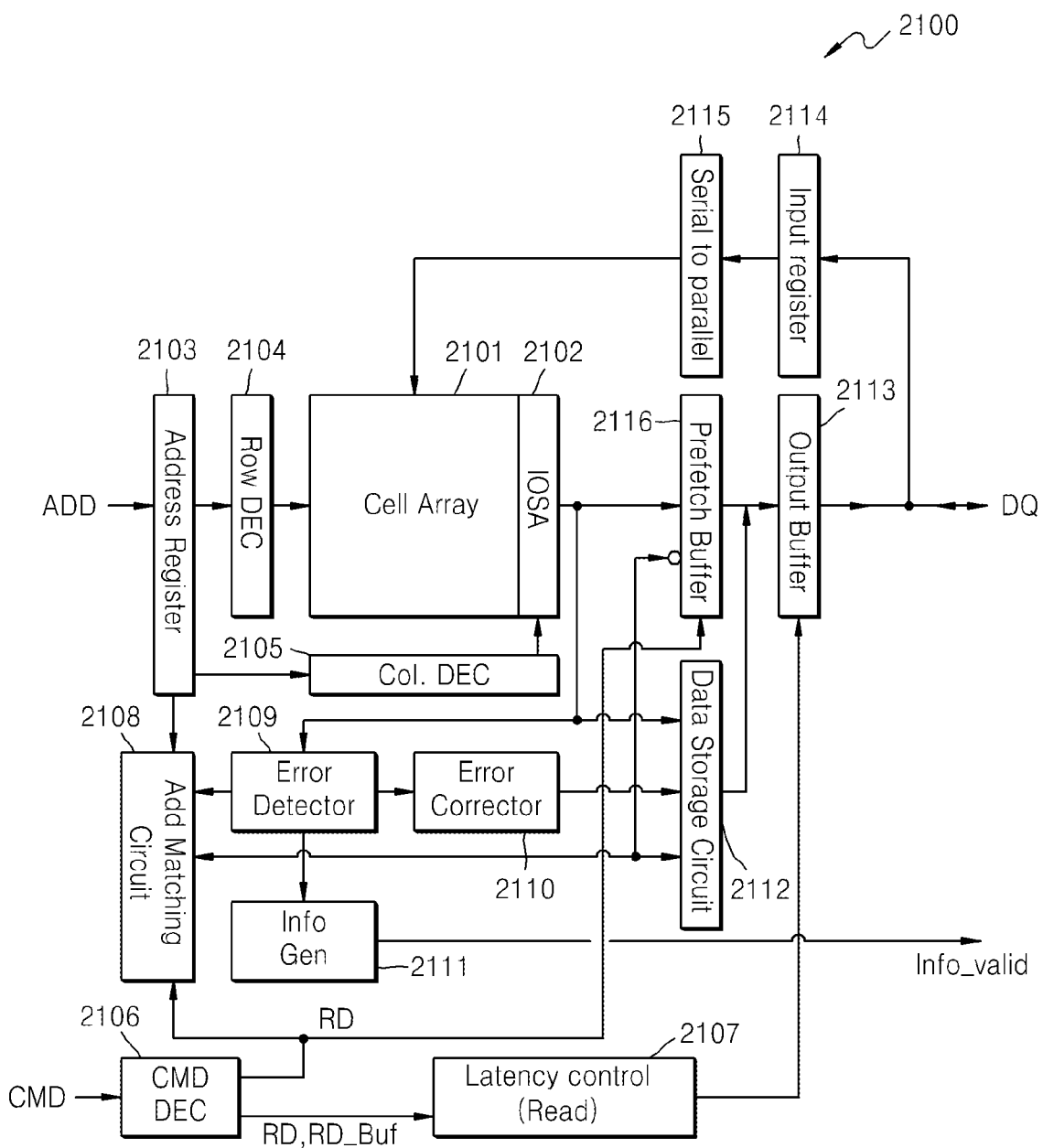
FIGS. 20 and 21 are block diagrams illustrating semiconductor memory devices according to example embodiments.
Figure 21:
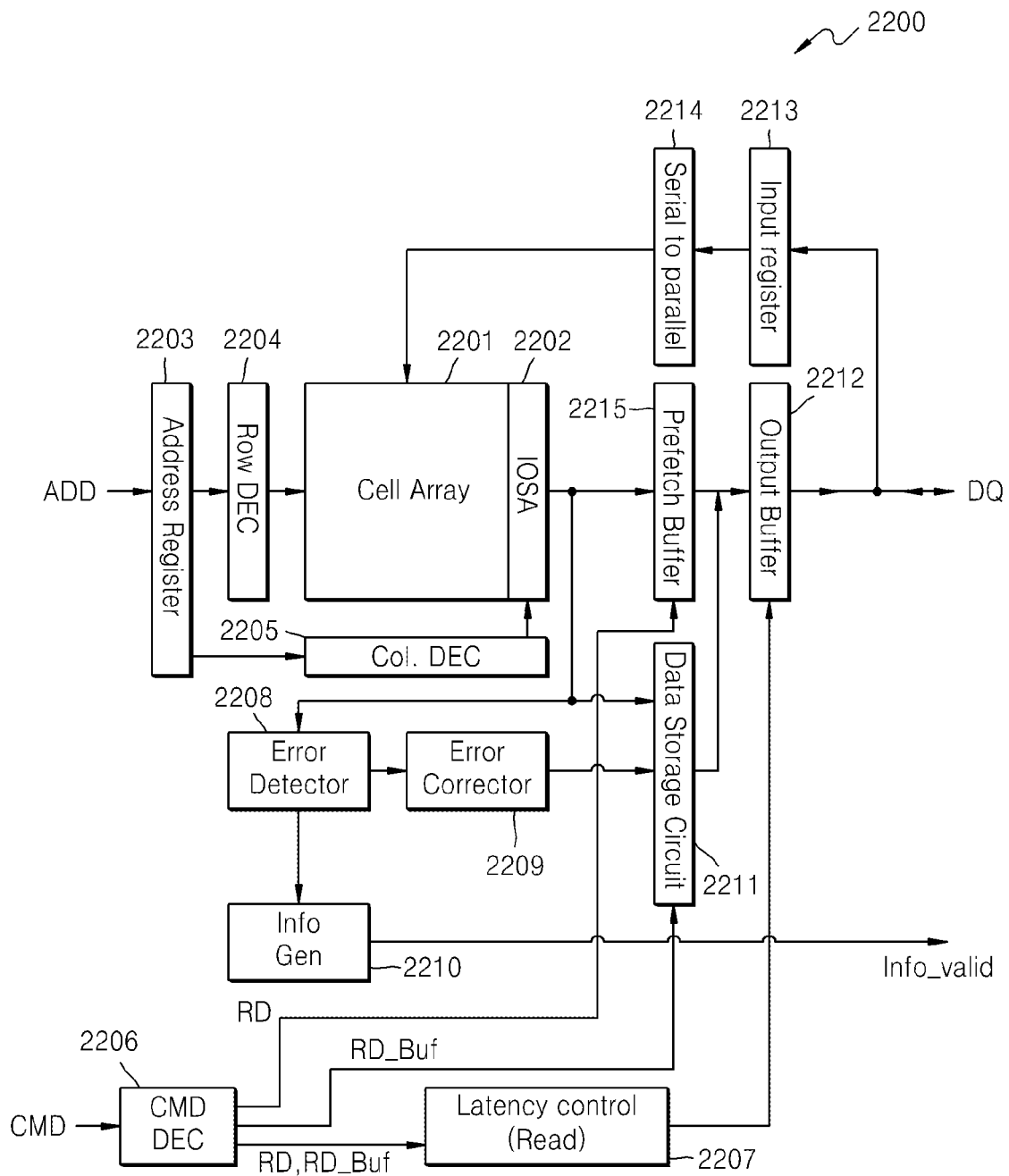

FIGS. 20 and 21 are block diagrams illustrating semiconductor memory devices according to example embodiments. In more detail, FIGS. 20 and 21 are detailed block diagrams of semiconductor memory devices 2100 illustrating example operations according to example embodiments. FIG. 20 illustrates an example in which a data buffer is accessed by a typical read command, and FIG. 21 illustrates an example in which a data buffer is accessed by a buffer read command.

As illustrated in FIG. 20, the semiconductor memory device 2100 includes a cell array 2101, an input/output sense amplifier 2102, an address register 2103, a row decoder 2104, a column decoder 2105, a command decoder 2106, a latency control circuit 2107, an address matching circuit 2108, an error detector 2109, an error corrector 2110, an information generating circuit 2111, a data storage circuit 2112, an output buffer 2113, an input register 2114, a data converting circuit 2115, and a prefetch buffer 2116. Detailed description of structures and configurations of the semiconductor memory devices 2100 that are the same as or similar to those described with reference to the other example embodiments will be omitted.

A command CMD input from the outside passes the command decoder 2106 to be provided to the latency control circuit 2107, the address matching circuit 2108, and the prefetch buffer 2116. The command CMD may include a command for various memory operations, for example, a read command RD or a buffer read command RD_Buf. Also, an address ADD input from the outside passes the address register 2103 and is provided to the row decoder 2104, the column decoder 2105, and the address matching circuit 2108.

As in some of the above-described example embodiments, invalid data and corresponding address information may be stored in the data storage circuit 2112. The address matching circuit 2108 may receive the address information to perform a matching operation, or an additional storage circuit may be included in the address matching circuit 2108 and the address information may be stored in the additional storage circuit of the address matching circuit 2108. When a read command RD or an address ADD are received from the outside, the address matching circuit 2108 compares the received address ADD and the previously stored address information to generate a matching result. According to the matching result, a control signal for accessing the data storage circuit 2112 is provided to the data storage circuit 2112.

According to the matching result, the data stored in the data storage circuit 2112 may be provided to the output buffer 2113, or data read from the cell array 2102 may pass the prefetch buffer 2116 and be provided to the output buffer 2113. According to control of the latency control circuit 2107, after receiving the read command RD and after a given, desired or predetermined latency, data stored in the output buffer 2113 is output to the memory controller.

The error detector 2109 performs error detection with respect to the data read from the cell array 2101, and the error corrector 2110 performs error correction with respect to invalid data stored in the data storage circuit 2112 according to a result of the error correction. Also, the information generating circuit 2111 generates information Info_valid indicating whether data is valid or not according to the result of the error detection and provides the information Info_valid to the memory controller.

The input register 2114 receives write data when a data write operation is performed, and the data converting circuit 2115 converts serially received write data to parallel data and provides the same to the cell array 2101.

An example of outputting data stored in a data buffer in response to a buffer read command is illustrated in the semiconductor memory device 2200 of FIG. 21. As illustrated in FIG. 21, the semiconductor memory device 2200 includes a cell array 2201, an input/output sense amplifier 2202, an address register 2203, a row decoder 2204, a column decoder 2205, a command decoder 2206, a latency control circuit 2207, an error detector 2208, an information generating circuit 2210, a data storage circuit 2211, an output buffer 2212, an input register 2213, a data converting circuit 2214, and a prefetch buffer 2215.

According to the example embodiment of FIG. 21, when a read command RD is received, the prefetch buffer 2215 is controlled by an output of the command decoder 2206, and data that is provided by the cell array 2201 and the input/output sense amplifier 2202 passes the output buffer 2212 to be provided to the outside. On the other hand, when a buffer read command RD_Buf is received, data stored in the data storage circuit 2211 is read according to an output of the command decoder 2206 and provided to the memory controller by using the output buffer 2212.

Figure 22:
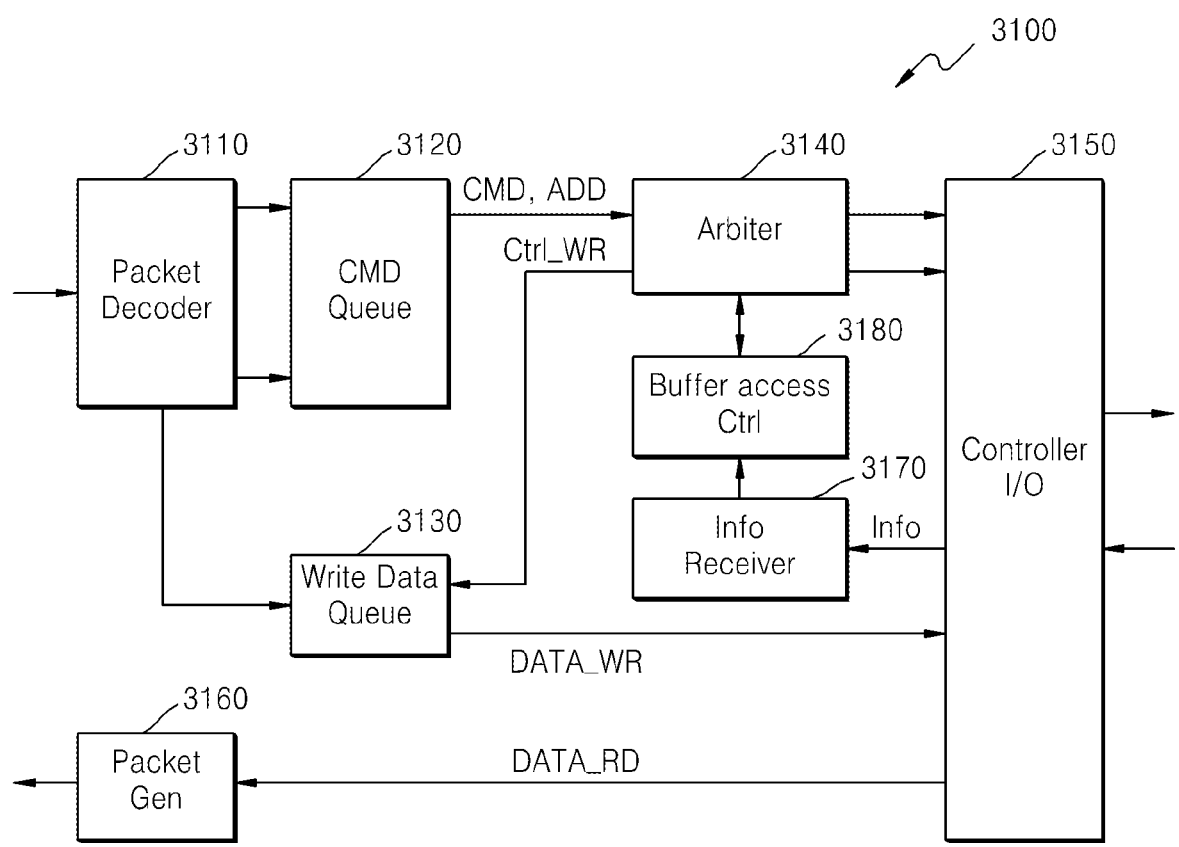
FIG. 22 is a block diagram illustrating a memory controller according to an example embodiment.

FIG. 22 is a block diagram illustrating a memory controller 3100 according to an example embodiment.

Referring to FIG. 22, the memory controller 3100 includes a packet decoder 3110, a command queue 3120, a write data queue 3130, an arbiter 3140, a controller input/output circuit 3150, and a packet generating circuit 3160. According to at least this example embodiment, the memory controller 3100 further includes an information receiving circuit 3170 and a buffer access control circuit 3180.

The packet decoder 3110 receives a packet including information used when accessing a semiconductor memory device, and decodes the packet. As the packet is decoded, a command CMD and an address ADD corresponding thereto are generated. For example, a command CMD and an address ADD may be generated per packet, or a plurality of commands CMD and a plurality of addresses ADD may be generated per packet.

The command queue 3120 has space for storing multiple commands CMD and multiple addresses ADD, and queues the commands and the addresses in the order in which they are input. The command queue 3120 may operate in a first in first out (FIFO) manner in which information that is first inserted into a list is also the first removed.

The arbiter 3140 receives a plurality of commands CMD and a plurality of addresses ADD corresponding to the commands CMD, which are stored in the command queue 3120, and controls the commands CMD and the addresses ADD to be executed according to priorities. Execution of the commands CMD and the addresses ADD may refer to an operation of outputting the commands CMD and the addresses ADD according to priorities to a semiconductor memory device.

The write data queue 3130 receives a write control signal Ctrl_WR from the arbiter 3140, and outputs data transmitted from the packet decoder 3110 to the controller input/output circuit 3150 in response to a write control signal Ctrl_WR. The packet generating circuit 3160 may receive data read from the semiconductor memory device to generate a packet, and the generated packet may be output to an external device, for example, a central processing unit (not shown).

The controller input/output circuit 3150 may be formed of a physical layer region. Accordingly, the controller input/output circuit 3150 may define an interface between transmission media and provides mechanical, electrical, and functional procedural units for signal transmission between data link layers. The controller input/output circuit 3150 transmits a command CDM, an address ADD, and data DATA or the like generated in the memory controller 3100 to a semiconductor memory device.

According to at least some example embodiments, the information receiving circuit 3170 receives first information indicating whether various types of information output by a semiconductor memory device are valid, second information indicating whether error correction of data is possible, third information indicating a position of a buffer in which data is stored, and fourth information indicating whether all buffers are currently in use. The received information is provided to the buffer access control circuit 3180, and based on the received information the buffer access control circuit 3180 provides to the arbiter 3140 a signal for controlling a data buffer access with respect to a semiconductor memory device.

The buffer access control circuit 3180 may include a given, desired or predetermined storage circuit (e.g., a register), and a type of a currently output command and flag information indicating whether a memory operation according to an output command is completed may be stored in the storage circuit. For example, when a first read command is output, a flag indicating whether valid data is received in response to the first read command may be stored together with information that designates a first read command. If information indicating that data read from a semiconductor memory device is not invalid is received, the buffer access control circuit 3180 determines that valid data corresponding to the first read command is not received.

The buffer access control circuit 3180 determines whether a read command, in response to which valid data is not received, in regard to read commands that are output to a semiconductor memory device, by checking the flag information. If valid data is not received in response to a first read command, the buffer access control circuit 3180 allows a command and an address for accessing error-corrected data stored in a data buffer of a semiconductor memory device to be output, by controlling the arbiter 3140. A first read command and an address corresponding thereto may be stored in the command queue 3120 or the arbiter 3140, and an operation of accessing the data buffer of the semiconductor memory device is requested by outputting the command and the address to the semiconductor memory device again. As described above, when the address output by the memory controller 3100 and an address stored in the data buffer of the semiconductor memory device match with each other, error-corrected data stored in the data buffer is provided to the memory controller 3100.

Figure 23:
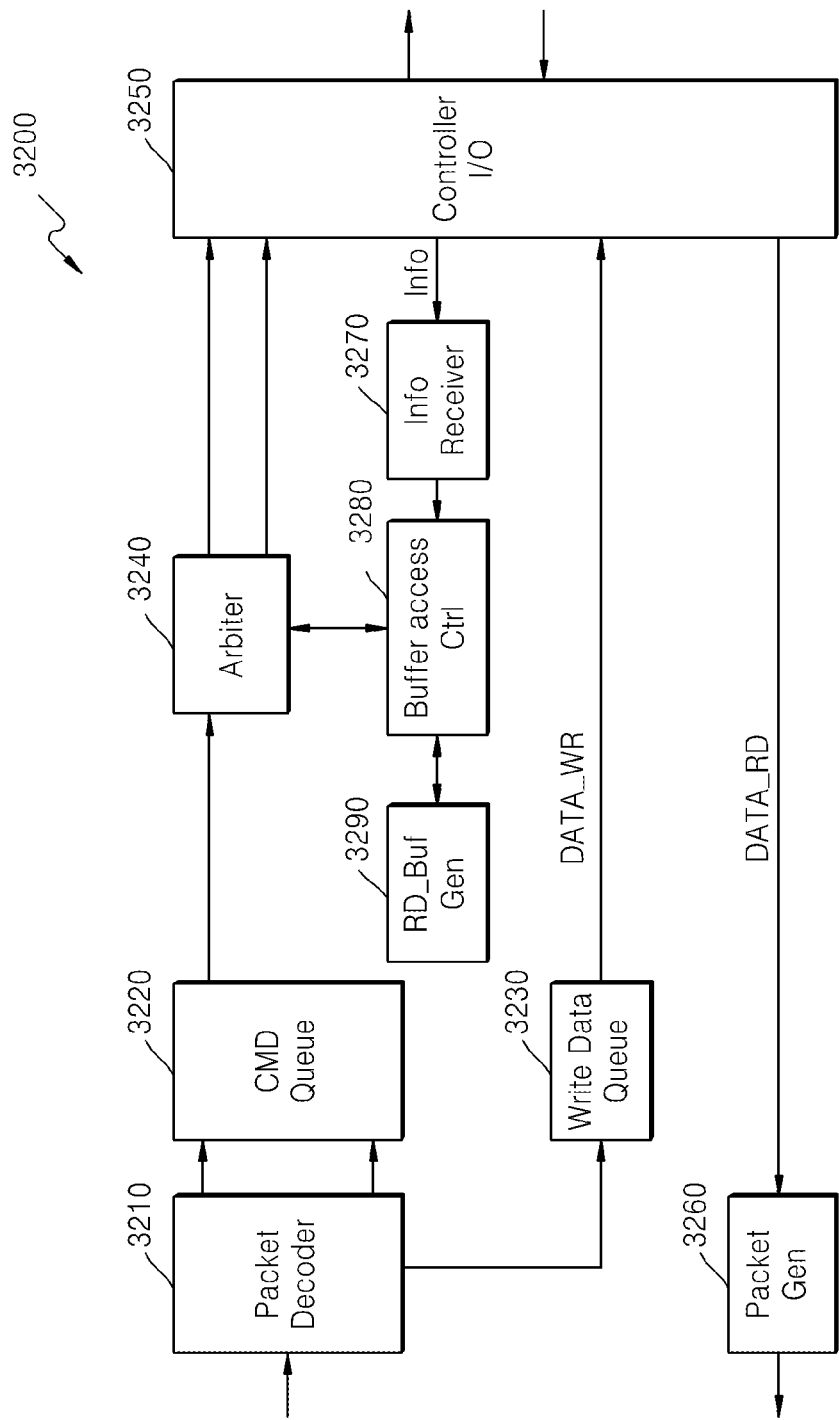
FIG. 23 is a block diagram illustrating a memory controller according to another example embodiment.

FIG. 23 is a block diagram illustrating a memory controller 3200 according to another example embodiment. In FIG. 23, an example in which the memory controller 3200 outputs a buffer read command in order to access a data buffer of the semiconductor memory device 2300 is illustrated. Elements illustrated in FIG. 23 that are the same or substantially the same as elements illustrated in FIG. 22 have the same or similar operations, and thus detailed descriptions thereof will be omitted.

Referring to FIG. 23, the memory controller 3200 includes a packet decoder 3210, a command queue 3220, a write data queue 3230, an arbiter 3240, a controller input/output circuit 3250, and a packet generating circuit 3260. Also, according to at least this example embodiment, the memory controller 3200 further includes an information receiving circuit 3270, a buffer access control circuit 3280, and a buffer read command generating circuit 3290.

The information receiving circuit 3270 receives various types of information output by the semiconductor memory device, and the received information is provided to the buffer access control circuit 3280. Based on the received information, the buffer access control circuit 3280 provides to the arbiter 3240 a signal for controlling data buffer access with respect to the semiconductor memory device.

The buffer access control circuit 3280 determines whether a read command, regarding which valid data is not received, exists by checking flag information stored in the buffer access control circuit 3280. If valid data is not received, a buffer read command generated by using the buffer read command generating circuit 3290 in order to access the data is provided to the buffer access control circuit 3280. Also, buffer address information of the data buffer is received from the semiconductor memory device, and the buffer address information is provided to the buffer access control circuit 3280.

In consideration of time needed for error correction in the semiconductor memory device (e.g., multi-bit error correction), the buffer access control circuit 3280 may provide a buffer read command and a buffer address to the arbiter 3240 after a given, desired or predetermined latency. The read command and the buffer address may be output to the semiconductor memory device through the controller input/output circuit 3250, and accordingly, error-corrected data stored in the data buffer of the semiconductor memory device may be provided to the memory controller 3200.

Figure 24A:
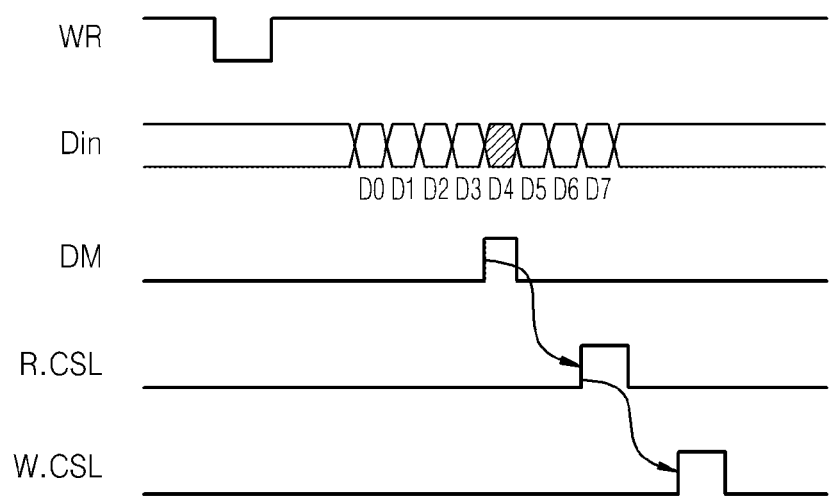
FIG. 24A is a timing diagram illustrating example operation of a semiconductor memory device according to an example embodiment.
Figure 24B:
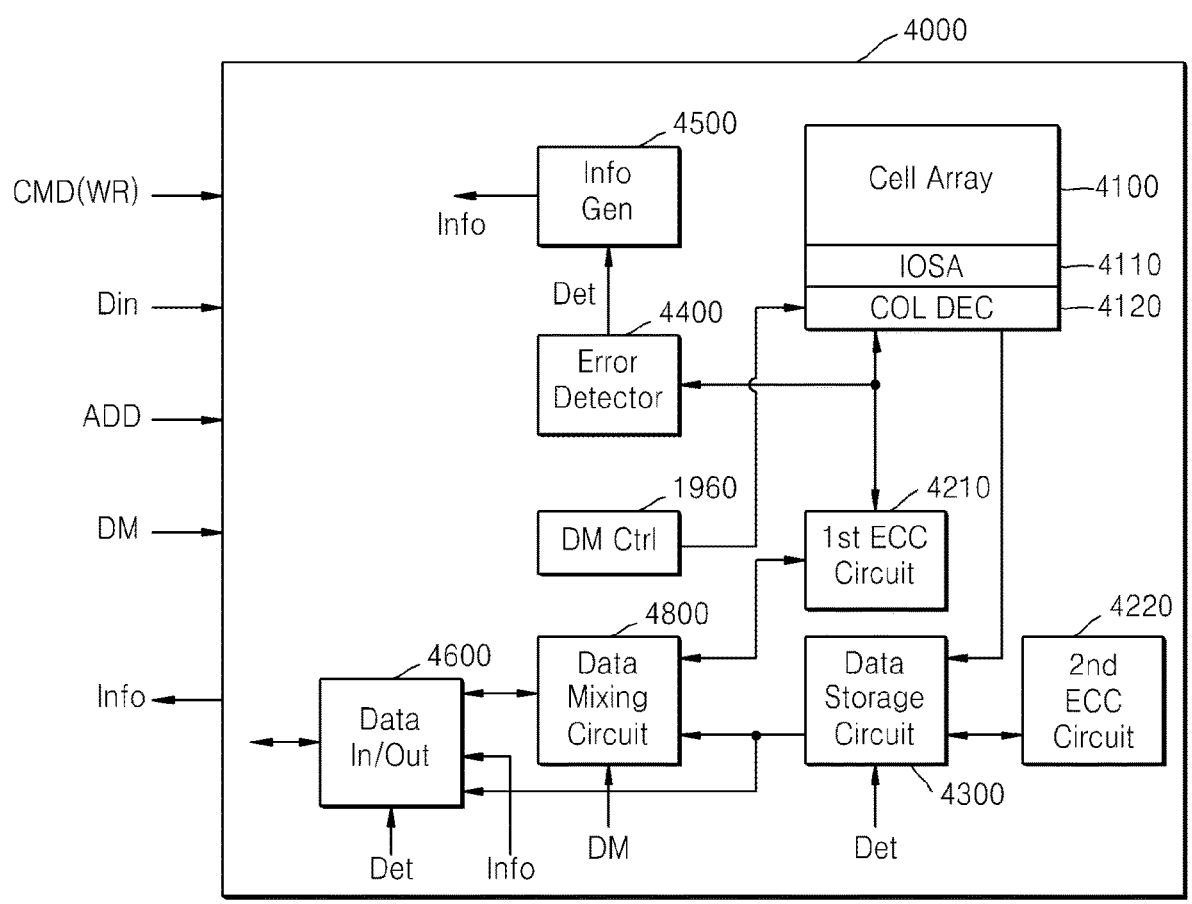
FIG. 24B is a block diagram illustrating a semiconductor memory device according to another example embodiment.

FIG. 24A is a timing diagram illustrating example operation of a semiconductor memory device according to an example embodiment; FIG. 24B is a block diagram illustrating a semiconductor memory device according to another example embodiment. In FIGS. 24A and 24B, an example in which various types of information described above are provided to a memory controller in response to a write command is illustrated.

As illustrated in FIG. 24B, the semiconductor memory device 4000 includes a cell array 4100, an input/output sense amplifier 4110, a column decoder 4120, first and second ECC circuits 4210 and 4220, a data storage circuit 4300, an error detector 4400, an information generating circuit 4500, a data input/output circuit 4600, a data masking control circuit 4700, and a data mixing circuit 4800. The semiconductor memory device 4000 receives a write command WR, an address ADD corresponding thereto and write data Din. Also, the semiconductor memory device 4000 receives a masking signal DM for suppressing and/or preventing at least a portion of write data Din from being written to the cell array 4100, and outputs at least one piece of information Info from among a plurality of pieces of information described with reference to the other example embodiments, to the memory controller, in response to the write command WR.

Referring to FIG. 24A, a write command WR is activated, and write data Din D0-D7 corresponding thereto is input. In order to mask at least a portion of the write data Din D0-D7 (e.g., fifth data D4), a masking signal DM is activated in response to a reception timing of the fifth data D4. The semiconductor memory device 4000 may perform a read-modified-write (RMW) operation in response to activation of the masking signal DM. The RMW operation may include reading a region of the cell array 4100 corresponding to an address ADD corresponding to a write command, combining the read data with write data Din D0-D7, generating a parity bit corresponding to the combined data, and writing the combined data and the parity bit to the cell array 4100. A read column selection signal R.CSL of FIG. 24A is a signal for selecting a column for the reading operation, and a write column selection signal W.CSL is a signal for selecting a column for a write operation of the combined data.

In this example, the fifth data D4 from among the write data Din D0-D7 is not recorded to the cell array 4100 by a data masking operation, some pieces of the write data D0-D3 and D5-D7 are combined with previous data at a position of the cell array 4100 to which the fifth data D4 is to be recorded, and a parity bit corresponding to the combined data has to be generated. Also, when performing the RMW operation, error detection described above may be performed with respect to data that is read before data combining, and data combining described above may be performed by using error-corrected data when an error is generated.

As illustrated in FIG. 24B, data is read according to the RMW operation and provided to the data mixing circuit 4800 by using the first ECC circuit 4210. The read data is provided to the error detector 4400, and the information generating circuit 4500 generates various types of information Info according to a result of error detection, and provides the same to the memory controller. In the case of the operation of providing information Info, any one of the above-described example embodiments may be applied. The memory controller may determine whether data read by the RMW operation is valid or not by receiving information Info from the semiconductor memory device 4000 after outputting a write command WR together with a masking signal DM. When data is valid, it is determined that a data write operation according to a normal RMW operation is to be performed, and a command for subsequent memory operations may be output. On the other hand, when the read data is not valid, a management operation such as delaying an output of a command for performing subsequent memory operations may be performed in consideration of time needed for error correction (e.g., time needed for multi-bit error correction).

The data mixing circuit 4800 combines at least a portion of write data Din D0-D7 and at least a portion of the read data in response to a masking signal DM, and provides the combined data to the first ECC circuit 4210. The first ECC circuit 4210 provides the combined data and a parity corresponding thereto to the cell array 4100 via the input/output sense amplifier 4110 and the column decoder 4120.

If the read data is not valid, as in the above-described example embodiment, then invalid data is stored in the data storage circuit 4300, and error corrected by using the second ECC circuit 4220. The data mixing circuit 4800 performs an operation of combining data by using at least a portion of the write data Din D0-D7 and the data provided from the data storage circuit 4300.

According to at least this example embodiment, the semiconductor memory device 4000 performs error detection and an operation of outputting information in response to a read command as in the above-described example embodiment. In addition, when a write command including data masking is received, data may be further read via an RMW operation in response to the write command including data masking, and an operation of outputting information according to a result of error detection with respect to the read data may be further performed.

Figure 25:
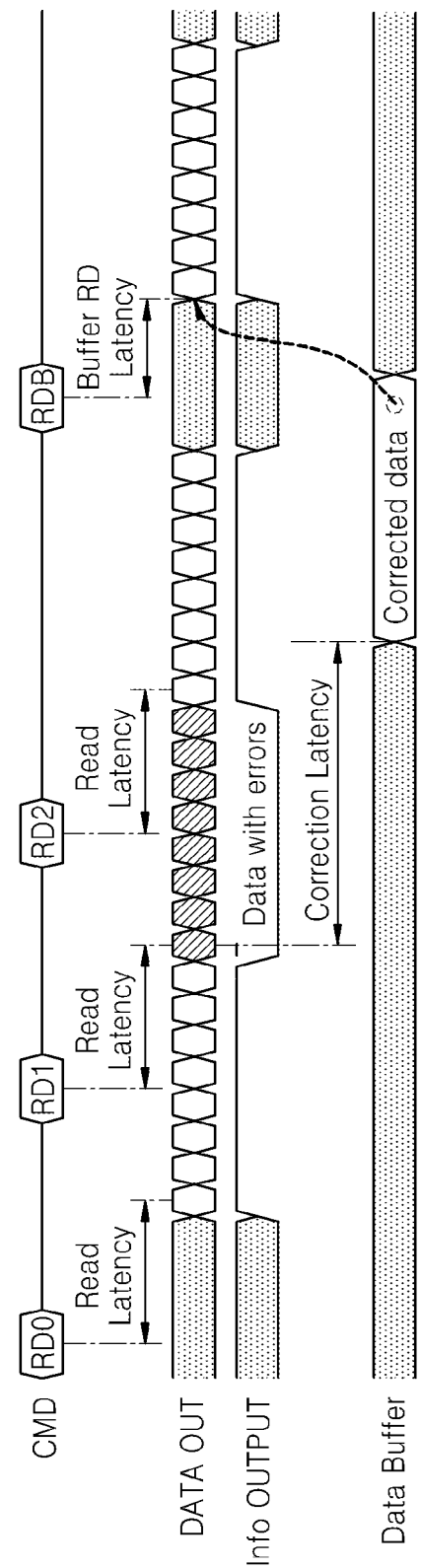
FIGS. 25 through 27 are waveform diagrams illustrating example status of data inputs and output according to example embodiments.
Figure 26:
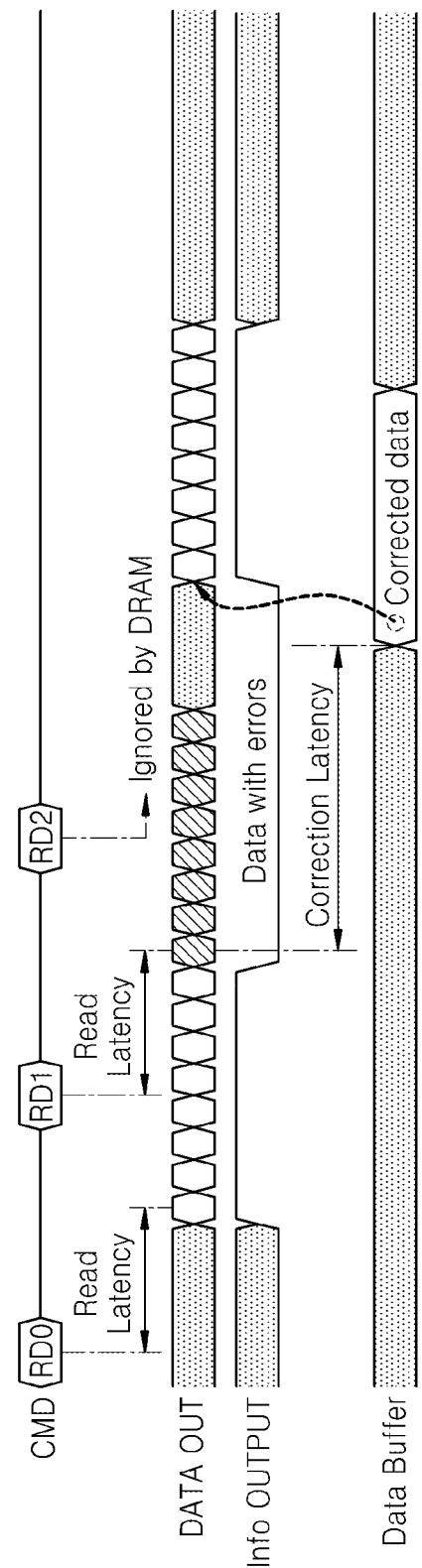
Figure 27:
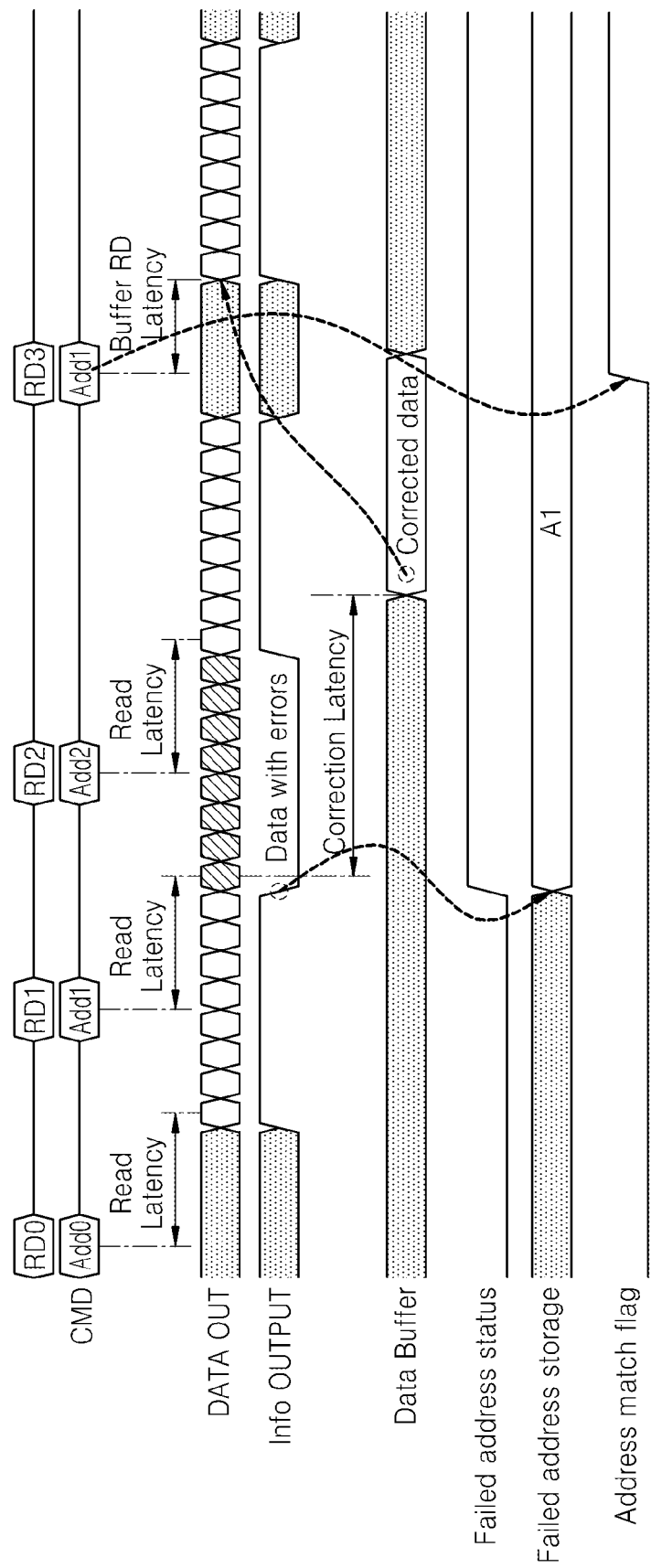

FIGS. 25 through 27 are waveform diagrams illustrating a status of data input and output according to an example embodiment.

FIG. 25 illustrates an example in which error-corrected data stored in a data buffer is output to a memory controller in response to a buffer read command. As illustrated in FIG. 25, as a first read command RD0 is received, data is output after a given, desired or predetermined read latency. In a read latency section, error is detected and information Info according to a result of error detection is output. The information Info is information indicating whether the data is valid. Read data and activated information Info are output to the memory controller depending on whether the read data is valid. Assuming that 1 bit error is determined as valid, data, 1 bit error of which is corrected, may be output to the memory controller.

On the other hand, when data that is read in response to a second read command RD1 is invalid data, deactivated information Info is output to the memory controller according to a result of error detection. In this case, the read data (e.g., invalid data) may or may not be output to the memory controller. As in the above-described example embodiment, when other information than the information indicating whether the data is valid is output through a data terminal DQ, invalid data may not be output.

When the memory controller receives information indicating that data read in response to the second read command RD1 is not valid, the memory controller provides a third read command RD2 to the semiconductor memory device again without having to wait for valid data to be received, and the semiconductor memory device reads data in response to the third read command RD2, and outputs valid data after error detection, to the memory controller.

The memory controller outputs a buffer read command RDB after a correction latency for correcting invalid data. The semiconductor memory device outputs, together with error-corrected data stored in the data buffer after a buffer read latency, activated information Info indicating that the data is valid, to the memory controller.

FIG. 26 illustrates an example in which an error of invalid data is corrected without an additional command and output to a memory controller.

As illustrated in FIG. 26, when data that is read in response to a first read command RD0 is valid, valid data is output, and also, information Info indicating that the data is valid is activated and also output to the memory controller. On the other hand, if data read in response to a second read command RD1 is not valid, then valid data is not output, and information Info indicating that data corresponding to the second read command RD1 is valid is deactivated and output to the memory controller. The invalid data may or may not be output to the memory controller.

An algorithm for correcting an error of the invalid data is performed in the semiconductor memory device. In this example, another command (e.g., third read command RD2) is received before error correction of the data and output thereof are completed, and the above another command is ignored by the semiconductor memory device. Then, error-corrected data is output to the memory controller, and when the error-corrected data is output, the information Info is also activated and provided to the memory controller. The semiconductor memory device performs a memory operation corresponding to subsequently received command.

FIG. 27 illustrates an example in which error-corrected data that is stored in a data buffer in response to a typical read command is output to a memory controller.

As a first read command RD0 is received, data is read from a cell array in response to the first read command RD0, and as the read data is valid, the valid data is output, and in addition, information Info indicating that corresponding data is valid is activated and provided to the memory controller.

Data that is read in response to the second read command RD1 is invalid data, and information Info indicating that data is valid is deactivated and provided to the memory controller. The invalid data is stored in the data buffer in the semiconductor memory device, and an algorithm for correcting an error is performed. Also, a second address Add1 (which may be referred to as a fail address) that is received with the second read command RD1 is stored in the semiconductor memory device. Also, status information indicating that a fail address is stored is activated.

Before error-corrected data is output, a third read command RD2 and a third address Add2 are received. According to whether status information indicating that the fail address is stored is activated or not, a matching operation is performed by using the received third address Add2. For example, an operation of comparing the second address Add1 and a third address Add2 is performed, and when the addresses do not match with each other, a flag indicating a result of matching the addresses maintains a deactivated status. Also, data is read from a cell array according to the third address Add2.

Then, a fourth read command RD3 and a fourth address Add1 may be received together. In this example, the fourth address Add1 is the same as the second address Add1. Consequently, the received fourth address Add1 and the second address Add1 match with each other, and a flag indicating a result of matching the addresses is activated. Data stored in the data buffer (error-corrected data) is read in response to the activated flag and output to the memory controller. Together with the data stored in the data buffer being output, information Info indicating that data is valid is activated and output to the memory controller.

Figure 28:
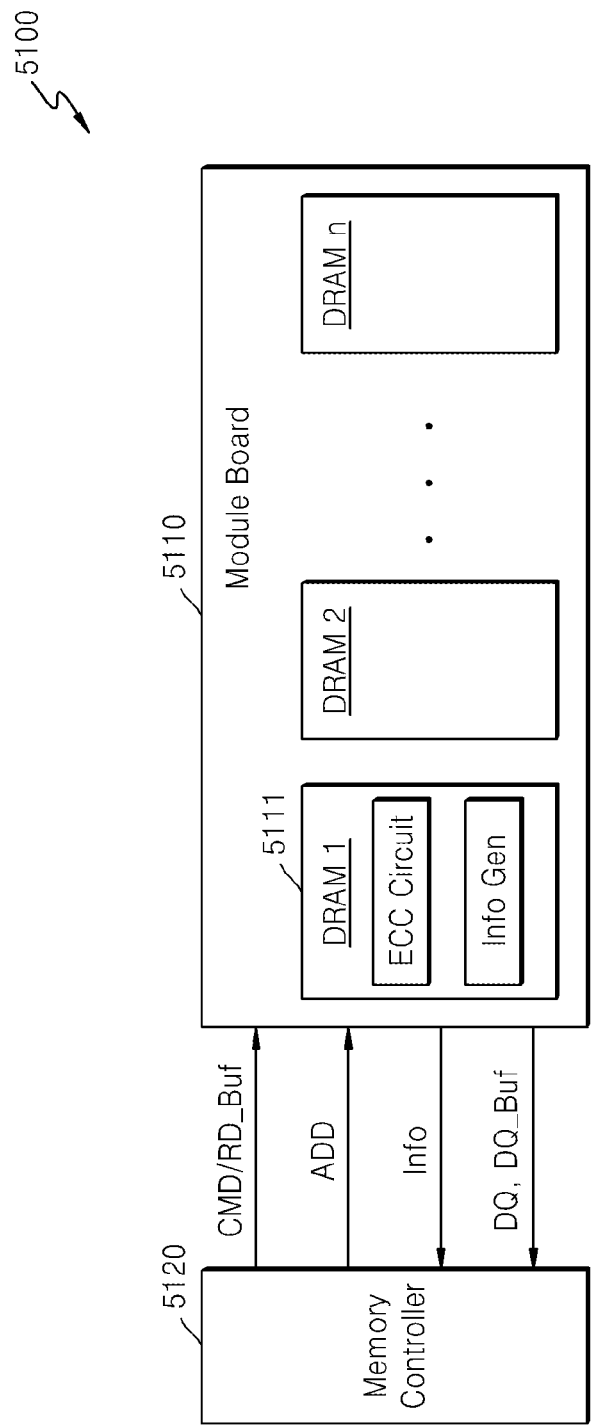
FIG. 28 is a block diagram illustrating a memory system including a semiconductor memory device, according to an example embodiment.

FIG. 28 is a block diagram illustrating a memory system 5100 including a semiconductor memory device according to an example embodiment.

As illustrated in FIG. 28, the memory system 5100 includes a memory module 5110 and a memory controller 5120. The memory module 5110 includes at least one semiconductor memory device 5111 mounted on a module board. The semiconductor memory device 5111 may be, for example, a DRAM chip. Also, a semiconductor memory device according to any one of the above-described example embodiments may be applied as the semiconductor memory device 5111.

The memory controller 5120 outputs various signals to control the semiconductor memory device 5111 included in the memory module 5110. For example, the memory controller 5120 outputs various commands CMD and an address ADD for a memory operation, and a buffer read command RD_Buf for accessing error-corrected data stored in a data buffer (not shown) included in the semiconductor memory device 5111.

An ECC circuit for correcting error of data may be included in the semiconductor memory device 5111, and an information generating circuit for generating various types of information Info according to a result of error detection of data may be included. According to the result of error detection, information Info indicating whether read data is valid is provided to the memory controller 5120. Also, data DQ read from a cell array may be provided to the memory controller 5120 according to a result of error detection, or invalid data may be temporarily stored in the data buffer, and error correction is performed thereto, and data DQ_Buf accessed from the data buffer may be provided to the memory controller 5120 in response to a given, desired or predetermined command (e.g., a buffer read command RD_Buf).

Figure 29:
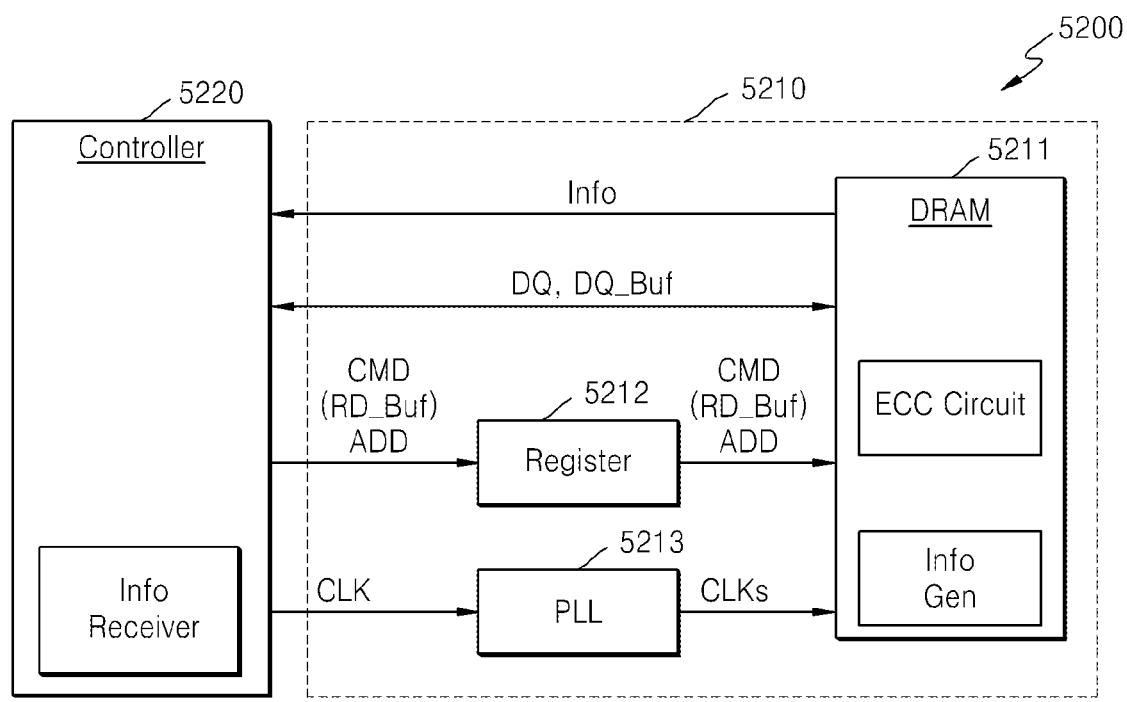
FIG. 29 is a block diagram illustrating a memory system including a semiconductor memory device, according to another example embodiment.

FIG. 29 is a block diagram illustrating a memory system 5200 including a semiconductor memory device according to another example embodiment.

As illustrated in FIG. 29, the memory system 5200 includes a memory module 5210 and a memory controller 5220, and the memory module 5210 is a semiconductor device that includes at least one DRAM chip 5211. The memory module 5210 of FIG. 29 illustrates an example in which a registered dual in-line memory module (RDIMM), which is a server module, is applied, and a register 5212 and a phase locked loop (PLL) 5213 or the like is mounted on a module board of the memory module 5210.

The memory module 5210 and the memory controller 5220 transmit or receive a signal via various systems busses. The register 5212 buffers a command CMD and an address ADD, and provides the buffered command CMD and the address ADD to the DRAM chip 5211. According to the above-described example embodiments, the command CMD may include a buffer read command RD_Buf for accessing error-corrected data stored in a data buffer (not shown) in the DRAM chip 5211. Also, the PLL 5213 receives a clock signal CLK and controls a phase thereof, and provides phase-adjusted clock signals CLKs to the DRAM chip 5211.

In addition, as in the above-described example embodiments, an ECC circuit for correcting an error of data may be included in the DRAM chip 5211, and an information generating circuit for generating various types of information Info according to a result of error detection with respect to data may be included. Information Info indicating whether read data is valid is provided to the memory controller 5220 according to a result of error detection, and data DQ read from a cell array or data DQ_Buf accessed from the data buffer is provided to the memory controller 5220. Also, the memory controller 5220 may include a circuit for receiving the information Info, and control an output operation of a command CMD according to the received information Info.

Figure 30A:
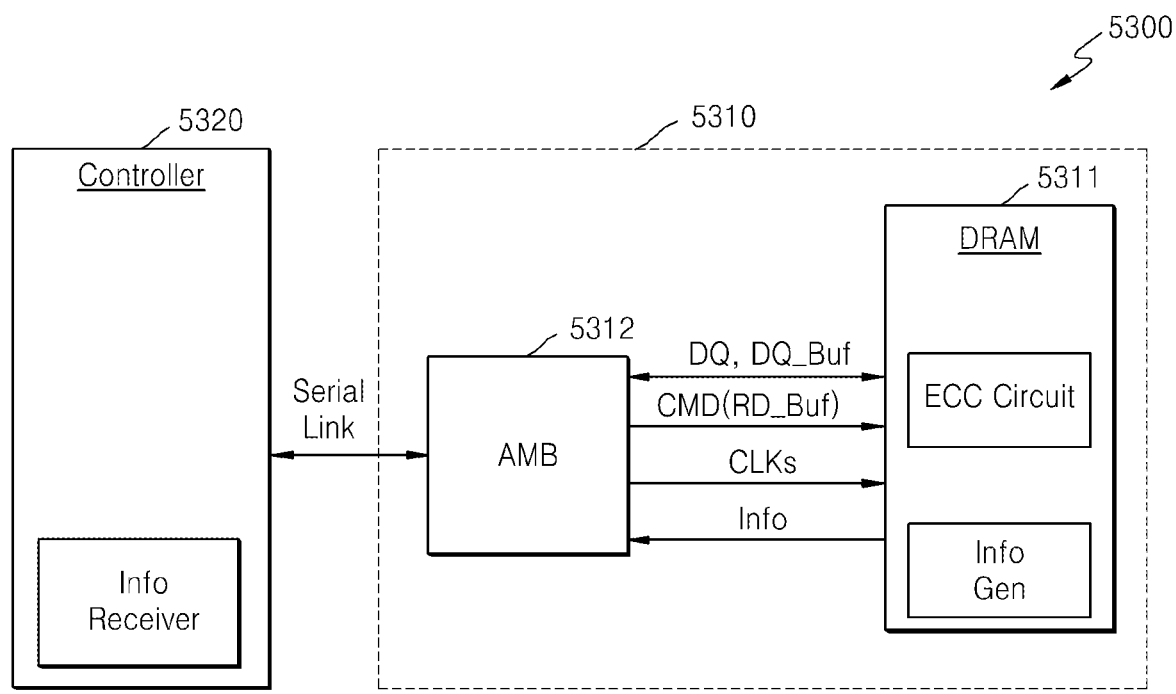
FIGS. 30A and 30B are block diagrams illustrating example embodiments of memory systems.
Figure 30B:
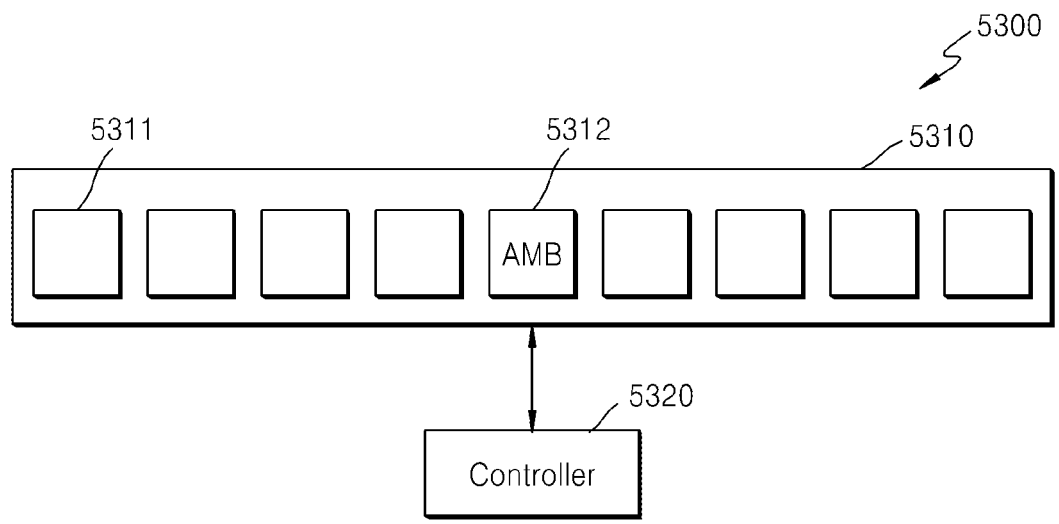

FIGS. 30A and 30B are block diagrams illustrating a memory system 5300 including a semiconductor memory device according to another example embodiment. A memory module 5310 of FIGS. 30A and 30B is an example in which a fully-buffered DIMM (FBDIMM) is applied.

As illustrated in FIG. 30A, the memory system 5300 includes a memory module 5310 and a memory controller 5320. The memory module 5310 includes at least one DRAM chip 5311 and at least one advanced memory buffer (AMB) 5312. The memory module 5310 that is in the form of a FBDIMM communicates with the memory controller 5320, and the memory controller 5320 and the AMB 5312 in the memory module 5310 are connected to each other in a point-to-point manner to perform serial communication. Accordingly, the number of memory modules 5310 connecting to the memory system 5300 may be increased, and thus a relatively large capacity may be provided, and also, as a FBDIMM uses a packet protocol, the memory system 5300 may be operated at relatively high speed.

As in the above-described example embodiment, the DRAM chip 5311 outputs various types of information Info according to a result of error detection of data in addition to outputting of a typical command CMD, clock signals CLKs or transmission or reception of data DQ, and receives a buffer read command RD_Buf for accessing a data buffer (not shown) in the DRAM chip 5311 and outputs the accessed data DQ_Buf from the data buffer. However, a signal sent from the DRAM chip 5311 may be provided to the memory controller 5320 after going through a packet conversion process by using the AMB 5312.

While a RDIMM or a FBDIMM is applied in the example embodiment discussed above, example embodiments are not limited thereto. Example embodiments may be applied to semiconductor memory devices, memory modules, or systems in various forms, and may also be applied to other types of memory modules such as a single in-line memory module (SIMM), a dual in-line memory module (DIMM), a small-outline DIMM (SO-DIMM), a unbuffered DIMM (UDIMM), a rank-buffered DIMM (RBDIMM), a mini-DIMM, and a micro-DIMM.

Figure 31:
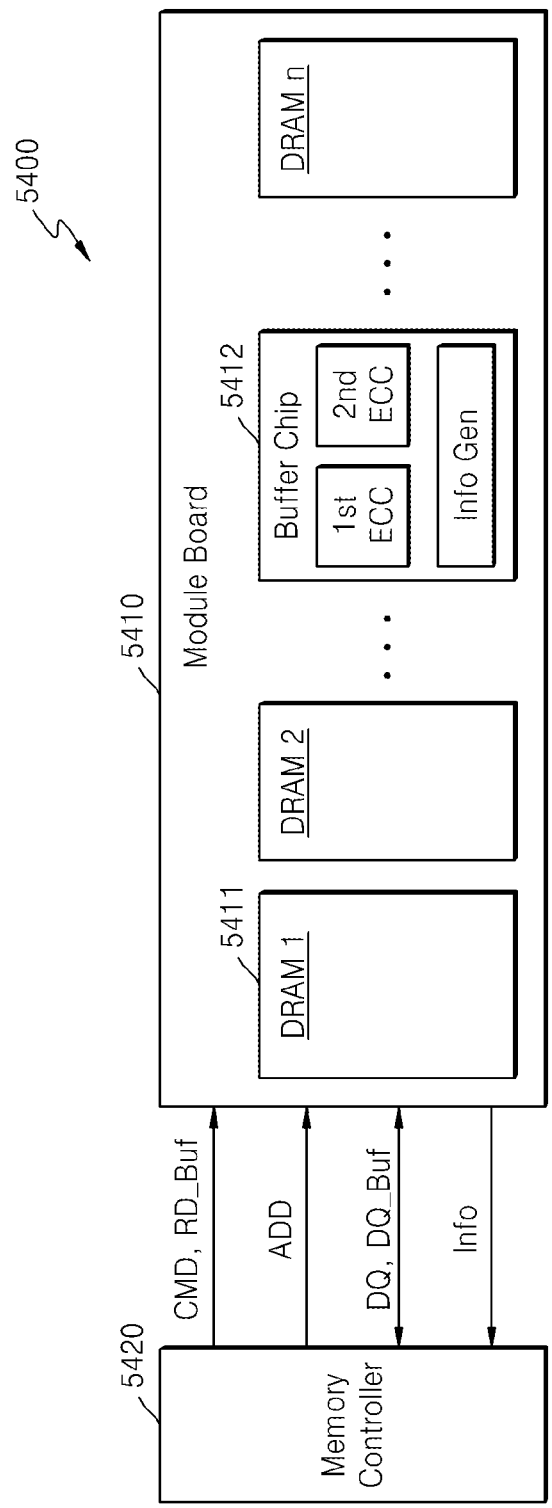
FIG. 31 is a block diagram illustrating another example embodiment of a memory system.

FIG. 31 is a block diagram illustrating a memory system 5400 including a semiconductor memory device according to an example embodiment. FIG. 31 illustrates a module, in which a buffer chip including an error corrector for correcting an error of data is mounted on a module board.

As illustrated in FIG. 31, the memory system 5400 includes a memory module 5410 and a memory controller 5420. The memory module 5410 includes at least one semiconductor memory device 5411 and at least one buffer chip 5412 mounted on a module board. A DRAM chip may be used as the semiconductor memory device 5411, and the buffer chip 5412 may perform various error correction operations according to the above-described example embodiments, and may also perform error detection operations of detecting whether data is valid or not. In addition, an information generating circuit for generating information indicating whether data is valid or not according to a result of error detection may be included in the buffer chip 5412. Also, at least one ECC circuit may be included in the buffer chip 5412, and for example, first and second ECC circuits may be included in the buffer chip 5412. Also, as described with reference to the above example embodiments, a data buffer (not shown) that temporarily stores invalid data may be further included in the buffer chip 5412.

According to a command CMD and an address ADD from the memory controller 5420, data is read from at least one semiconductor memory device 5411 included in the memory module 5410 and the read data is provided to the buffer chip 5412. The buffer chip 5412 generates information Info indicating whether data is valid, before performing multi-bit error correction, and outputs the information Info to the memory controller 5420. Also, the buffer chip 5412 stores invalid data that is received from the semiconductor memory device 5411 in the data buffer and performs error correction with respect to the same. Then, as a command for accessing a data buffer (e.g., a buffer read command RD_Buf) is received, data DQ_Buf stored in the data buffer is read and provided to the memory controller 5420.

Alternatively, an ECC circuit for correction of 1 bit error may be included in each semiconductor memory device 5411, and only an ECC circuit for correction or an error having at least two bits may be included in the buffer chip 5412. When 1 bit error is generated in read data, data, for which 1 bit error is corrected, is provided to the buffer chip 5412. The buffer chip 5412 performs an error detecting operation with respect to the data, and performs error detection and correction operations according to the above-described example embodiments and outputs data stored in the data buffer.

Figure 32:
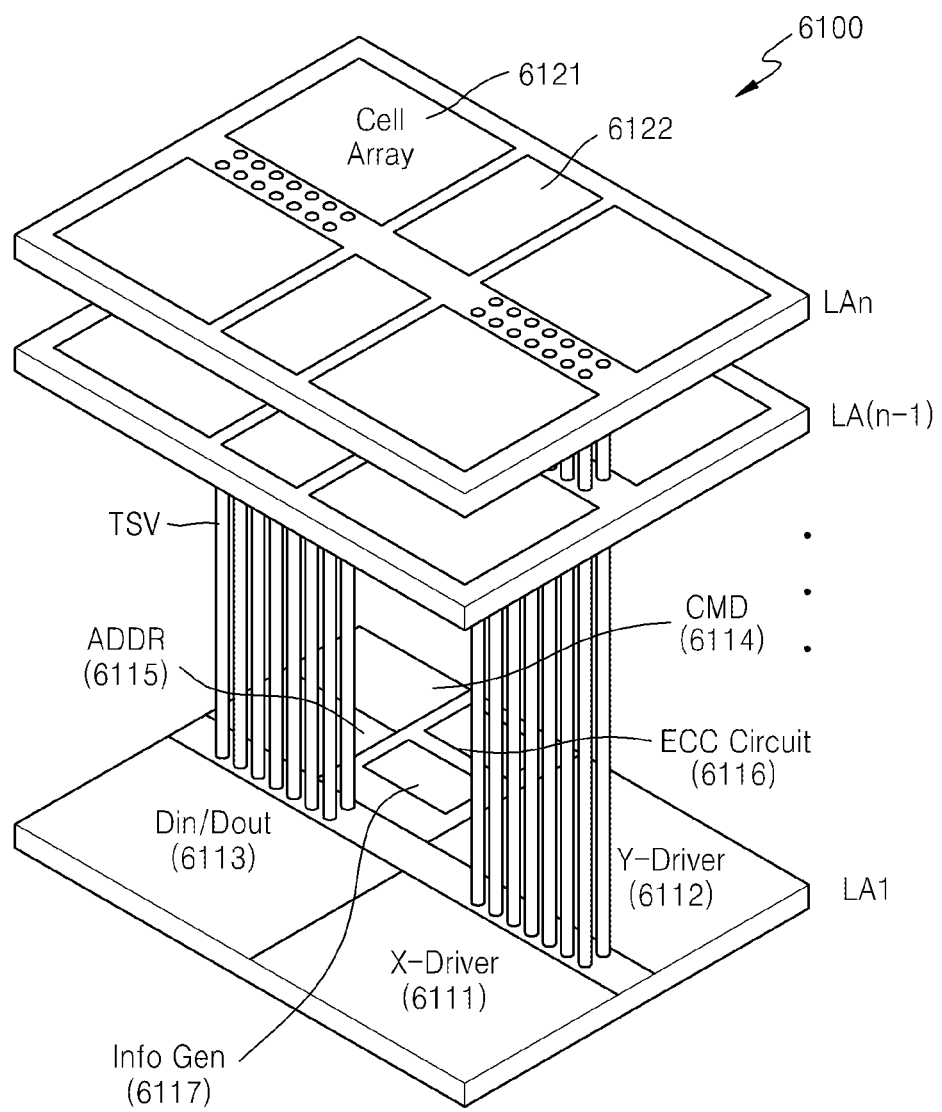
FIG. 32 is a structural diagram illustrating a semiconductor memory device according to another example embodiment.

FIG. 32 is a structural diagram illustrating a semiconductor memory device 6100 according to another example embodiment. FIG. 32 illustrates the semiconductor memory device 6100 formed by stacking a plurality of semiconductor layers.

As illustrated in FIG. 32, the semiconductor memory device 6100 includes a plurality of semiconductor layers. A first semiconductor layer LA1 through an n-th semiconductor layer LAn may each be a DRAM chip including a DRAM cell, or some of the semiconductor layers LA1 through LAn may be master chips that perform interfacing with respect to an external memory controller while the rest may be slave chips that store data. In the example embodiment of FIG. 32, the lowermost, first semiconductor layer LA1 is assumed to be a master chip, and the rest of the semiconductor layers LA2 through LAn are assumed to be slave chips.

The plurality of semiconductor layers LA1 through LAn transmit or receive a signal with respect to one another via a through silicon via TSV, and the master chip LA1 communicates with a memory controller via a conductive circuit (not shown) formed on an external surface thereof. A structure and operation of the semiconductor memory device 6100 will be described below while focusing on the first semiconductor layer LA1 as a master chip and an n-th semiconductor layer LAn as a slave chip.

The first semiconductor layer LA1 includes various circuits for driving a cell array 6121 included in the slave chips. For example, the first semiconductor layer LA1 includes a row driver (X-driver) 6111 for driving a word line of the cell array 6121, a column driver (Y-driver) 6112 for driving a bit line, a data input/output circuit 6113 for controlling input and output of data, a command decoder 6114 that decodes a command CMD from the outside, and an address buffer 6115 that receives an address from the outside and buffers the same.

In order to perform error detection and correction and provide information according to a result of error detection (e.g., information indicating whether read data is valid), according to the example embodiments, the first semiconductor layer LA1 includes an ECC circuit 6116 and an information generating circuit 6117. Data that is read from the semiconductor layers LA2 through LAn is provided to the first semiconductor layer LA1 through silicon via TSV, and information is generated based on error detection with respect to the read data, and an error of data stored in a data buffer (not shown) in the first semiconductor layer LA1 is corrected by using the ECC circuit 6116.

The n-th semiconductor layer LAn includes the cell array 6121 and other peripheral circuits for driving the cell array 6121. For example, a row/column selecting circuit (not shown) for selecting rows and columns of the cell array 6121 and a bit line sense amp (not shown) or the like may be included in a peripheral circuit region 6122.

Figure 33:
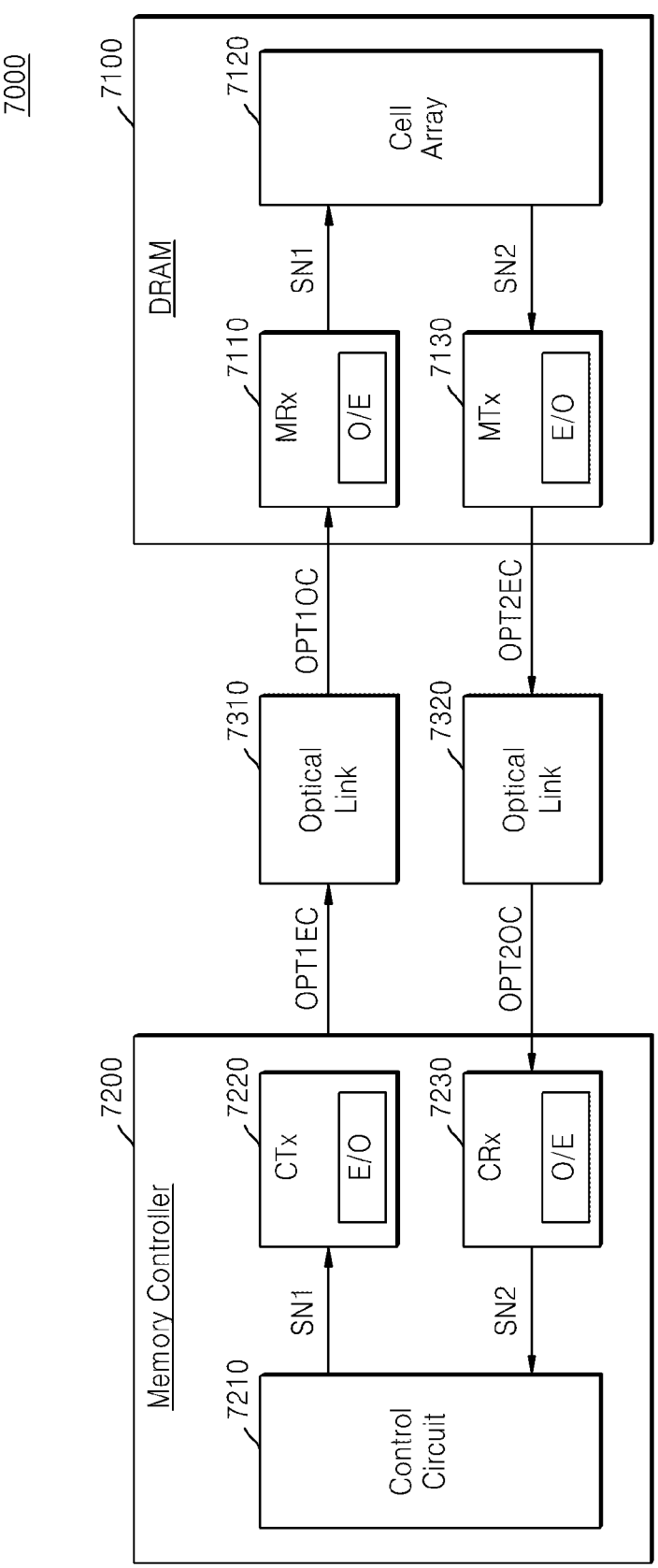
FIG. 33 is a block diagram illustrating an example embodiment of a memory system.

FIG. 33 is a block diagram illustrating a memory system 7000 including a semiconductor memory device according to an example embodiment.

Referring to FIG. 33, the memory system 7000 includes optical linking devices 7310 and 7320, a memory controller 7200, and a semiconductor memory device 7100. As the semiconductor memory device 7100, a DRAM chip is illustrated.

The optical linking devices 7310 and 7320 interconnect the memory controller 7200 and the semiconductor memory device 7100. The memory controller 7200 includes a control circuit 7210, a first transmitting circuit 7220, and a first receiving circuit 7230. The control circuit 7210 transmits a first electrical signal SN1 to the first transmitting circuit 7220. The first electrical signal SN1 may include a command, a clock signal, an address, data, or the like that are transmitted to the semiconductor memory device 7100. Also, according to at least this example embodiment, the first electrical signal SN1 may include a buffer read command for accessing data stored in a data buffer (not shown) in the semiconductor memory device 7100.

The first transmitting circuit 7220 includes an optical modulator E/O. The optical modulator E/O converts the first electrical signal SN1 to a first light transmission signal OPT1EC and transmits the same to the optical linking device 7310. The first receiving circuit 7230 includes an optical decoder O/E. The optical decoder O/E converts a second light reception signal OPT2OC received from the optical linking device 7320 to a second electrical signal SN2 and transmits the same to the control circuit 7210.

The semiconductor memory device 7100 includes a second receiving circuit 7110, a cell array 7120, and a second transmitting circuit 7130. The second receiving circuit 7110 includes an optical decoder O/E. The optical decoder O/E converts a first light reception signal OPT1OC received from the optical linking device 7310 to a first electrical signal SN1 and transmits the same to the cell array 7120.

The cell array 7120 writes write data to a memory cell in response to a first electrical signal SN1 and transmits read data to the second transmitting circuit 7130 as a second electrical signal SN2. The second electrical signal SN2 may include a clock signal, read data, or the like, that are transmitted to the memory controller 7200. Also, according to at least this example embodiment, the second electrical signal SN2 may further include buffer data accessed by a data buffer (not shown) in the semiconductor memory device 7100. The second transmitting circuit 7130 converts the second electrical signal SN2 to a second optical transmission signal OPT2EC and transmits the same to an optical linking device 7320. The second optical transmission signal OPT2EC is transmitted to the optical linking device 7320 via serial communication.

While not shown in FIG. 33, the semiconductor memory device 7100 may further include an error detector that performs error detection, an ECC circuit for error correction, and an information generating circuit that generates information according to a result of error detection, and information according to the result of error detection (e.g., information indicating whether data is valid) may also be modulated into a light transmission signal and provided to the memory controller 7200.

Figure 34:
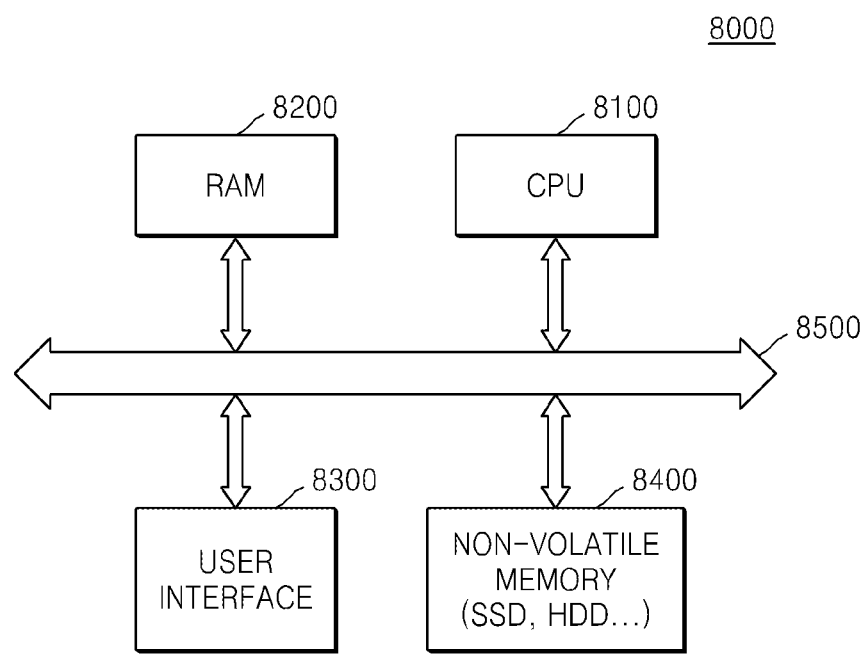
FIG. 34 is a block diagram illustrating a computing system in which a memory system according to an example embodiment is mounted.

FIG. 34 is a block diagram illustrating a computing system 8000 including a memory system according to an example embodiment. In the computing system 8000 such as a mobile device or a desktop computer, a RAM 8200 may be mounted as a semiconductor memory device according to at least this example embodiment. Any one of the semiconductor memory devices according to the above-described example embodiments may be applied as the RAM 8200 mounted as the semiconductor memory device. For example, the RAM 8200 may be formed of one of the semiconductor memory devices of the example embodiments or may be in the form of a memory module. Also, the RAM 8200 of FIG. 34 may include a semiconductor memory device and a memory controller.

The computing system 8000 according to at least this example embodiment includes a central processing unit 8100, a RAM 8200, a user interface 8300, and a non-volatile memory 8400, which are each electrically connected to a bus 8500. As the non-volatile memory 8400, a relatively large capacity storage device such as a solid state disk (SSD) or a hard disk drive (HDD) may be used.

In the computing system 9000, the RAM 8200 may include a semiconductor memory device including a cell array for storing data as in the above-described example embodiments, and in the semiconductor memory device, an information generating circuit that generates various types of information according to a result of error detection, a data buffer that temporarily stores invalid data, and an ECC circuit that corrects multi-bit error or the like may be included. Also, when the RAM 8200 is included as a memory module, an additional ECC chip may be mounted in the memory module.

While example embodiments have been particularly shown and described, it will be understood that various changes in form and details may be made therein without departing from the spirit and scope of the following claims.

What is claimed is:

1. A memory controller comprising:
a controller input/output circuit configured to output a first command to read first data from a memory device, and output a second command to read an error corrected data of the first data from the memory device; and
a correction status information receiver configured to receive correction status information from the memory device while reading the first data from the memory device,
wherein the controller input/output circuit outputs the second command in response to the received correction status information, the correction status information indicating whether a number of error bits in the first data is greater than or equal to a threshold value, and the controller input/output circuit further outputs at least one additional command between the first command and the second command.

2. The memory controller of claim 1, wherein the controller input/output circuit is further configured to output a first address information associated with the first data and to output a second address information associated with the error corrected data of the first data.

3. The memory controller of claim 2, the second address information is same with the first address information.

4. The memory controller of claim 2, wherein the second command is a buffer read command to read the error corrected data of the first data stored in a buffer, and the second address information which indicates a location of the error corrected data of the first data in the buffer is different from the first address information.

5. The memory controller of claim 1, wherein the at least one additional command initiates a memory operation of the memory device while the memory device is correcting errors of the first data, and completes the memory operation before outputting the second command.

6. The memory controller of claim 5, wherein the at least one additional command is one of row activation command, row pre-charge command, data read command and data write command.

7. The memory controller of claim 1, wherein a time delay between the first command and the second command is longer than an error correction time required to correct error detected in the first data.

8. The memory controller of claim 1, wherein the controller input/output circuit does not output the second command if the correction status information indicates that the number of error bits in the first data is smaller than the threshold value.

* * * * *